United States Patent
Plester et al.

(10) Patent No.: US 6,223,683 B1
(45) Date of Patent: May 1, 2001

(54) HOLLOW PLASTIC CONTAINERS WITH AN EXTERNAL VERY THIN COATING OF LOW PERMEABILITY TO GASES AND VAPORS THROUGH PLASMA-ASSISTED DEPOSITION OF INORGANIC SUBSTANCES AND METHOD AND SYSTEM FOR MAKING THE COATING

(75) Inventors: George Plester, Brussels (BE); Horst Ehrich, Dorsten (DE); Mark Rule, Atlanta, GA (US)

(73) Assignee: The Coca-Cola Company, Atlanta, GA (US)

( * ) Notice: Subject to any disclaimer, the term of this patent is extended or adjusted under 35 U.S.C. 154(b) by 0 days.

(21) Appl. No.: 08/818,342

(22) Filed: Mar. 14, 1997

(51) Int. Cl.⁷ .................................................. C23C 16/00

(52) U.S. Cl. ............................. 118/723 VE; 118/723 R; 118/718; 118/719; 118/729

(58) Field of Search ..................... 118/723 VE, 723 R, 118/718, 719, 729; 204/298.25

(56) References Cited

U.S. PATENT DOCUMENTS

| | | | |
|---|---|---|---|
| 2,664,852 | 1/1954 | Chadsey, Jr. ........................... | 118/49 |
| 2,665,226 | 1/1954 | Godley, 2nd et al. ................ | 117/107 |
| 2,996,037 | 8/1961 | Eng ......................................... | 118/49 |
| 3,016,873 | 1/1962 | Baer et al. ............................. | 118/49.1 |
| 4,230,068 | * 10/1980 | Itoh et al. .............................. | 118/634 |
| 4,438,368 | * 3/1984 | Abe et al. .............................. | 315/39 |
| 4,552,791 | 11/1985 | Hahn ....................................... | 428/35 |
| 4,573,429 | * 3/1986 | Cobbs et al. ........................... | 118/322 |
| 4,697,974 | * 10/1987 | Eltoukhy ................................ | 414/331 |
| 4,752,426 | * 6/1988 | Cho ......................................... | 264/22 |
| 4,765,273 | * 8/1988 | Anderle .................................. | 118/729 |

(List continued on next page.)

FOREIGN PATENT DOCUMENTS

| | | |
|---|---|---|
| 1521421 | 12/1969 | (DE) . |
| 3239131 | 4/1984 | (DE) . |
| 4305721 | 7/1994 | (DE) . |
| 4343042 | 3/1995 | (DE) . |
| 4412906 | 7/1995 | (DE) . |
| 0460796-A2 | 12/1991 | (EP) . |
| 0535810-A1 | 4/1993 | (EP) . |
| 0785291 | 7/1997 | (EP) . |
| 2139647 | 11/1984 | (GB) . |
| 2263472 | 7/1993 | (GB) . |
| 57-169088 | 10/1982 | (JP) . |
| 61-104075 | 5/1986 | (JP) . |
| 63-243264 | 10/1988 | (JP) . |
| 63-312968 | 12/1988 | (JP) . |
| 2-118064 | 5/1990 | (JP) . |
| 8-092764 | 4/1996 | (JP) . |

OTHER PUBLICATIONS

"Reactive Deposition of Insulating Compound Layers by Pulse Magnetron Sputtering" by Fraunhofer–Institut, Aug. 1996 Film Deposition Techniques, pp. 250–271.

"Glass" by J.H. Adams et al., vol. 12, pp. 555–627.

*Primary Examiner*—Jeffrie R Lund
(74) *Attorney, Agent, or Firm*—Sutherland Asbill & Brennan

(57) ABSTRACT

A method, composition and system for coating an external surface of containers and in particular, plastic containers, provides for low permeability to gases and vapors. The coating applied to the external surface of the containers is very thin and is comprised of one or several inorganic substances or layers of substances. For example, the coating can include silica which is bonded to the external surface of the container. This coating will be flexible and can be applied regardless of the container's internal pressure or lack thereof. The coating will firmly adhere to the container and possess an enhanced gas barrier effect after pressurization even when the coating is scratched, fractured, flexed and/or stretched. Moreover, this gas barrier enhancement will be substantially unaffected by filling of the container.

54 Claims, 20 Drawing Sheets

U.S. PATENT DOCUMENTS

| | | | | |
|---|---|---|---|---|
| 4,824,545 | * | 4/1989 | Arnold et al. | 204/298.25 |
| 4,888,199 | * | 12/1989 | Felts et al. | 427/10 |
| 4,975,168 | * | 12/1990 | Ohno et al. | 204/192.13 |
| 5,308,649 | * | 5/1994 | Babacz | 427/562 |
| 5,308,950 | | 5/1994 | Ramm et al. | 219/121.43 |
| 5,374,314 | * | 12/1994 | Babacz | 118/723 MP |
| 5,378,510 | * | 1/1995 | Thomas et al. | 427/563 |
| 5,521,351 | * | 5/1996 | Mahoney | 219/121.59 |
| 5,558,720 | | 9/1996 | Sarraf et al. | 118/726 |
| 5,565,248 | | 10/1996 | Plester et al. . | |
| 5,651,867 | * | 7/1997 | Kokaku et al. | 204/298.25 |
| 5,662,741 | | 9/1997 | Ehrich | 118/723 |
| 5,704,983 | * | 1/1998 | Thomas et al. | 118/723 MP |

* cited by examiner

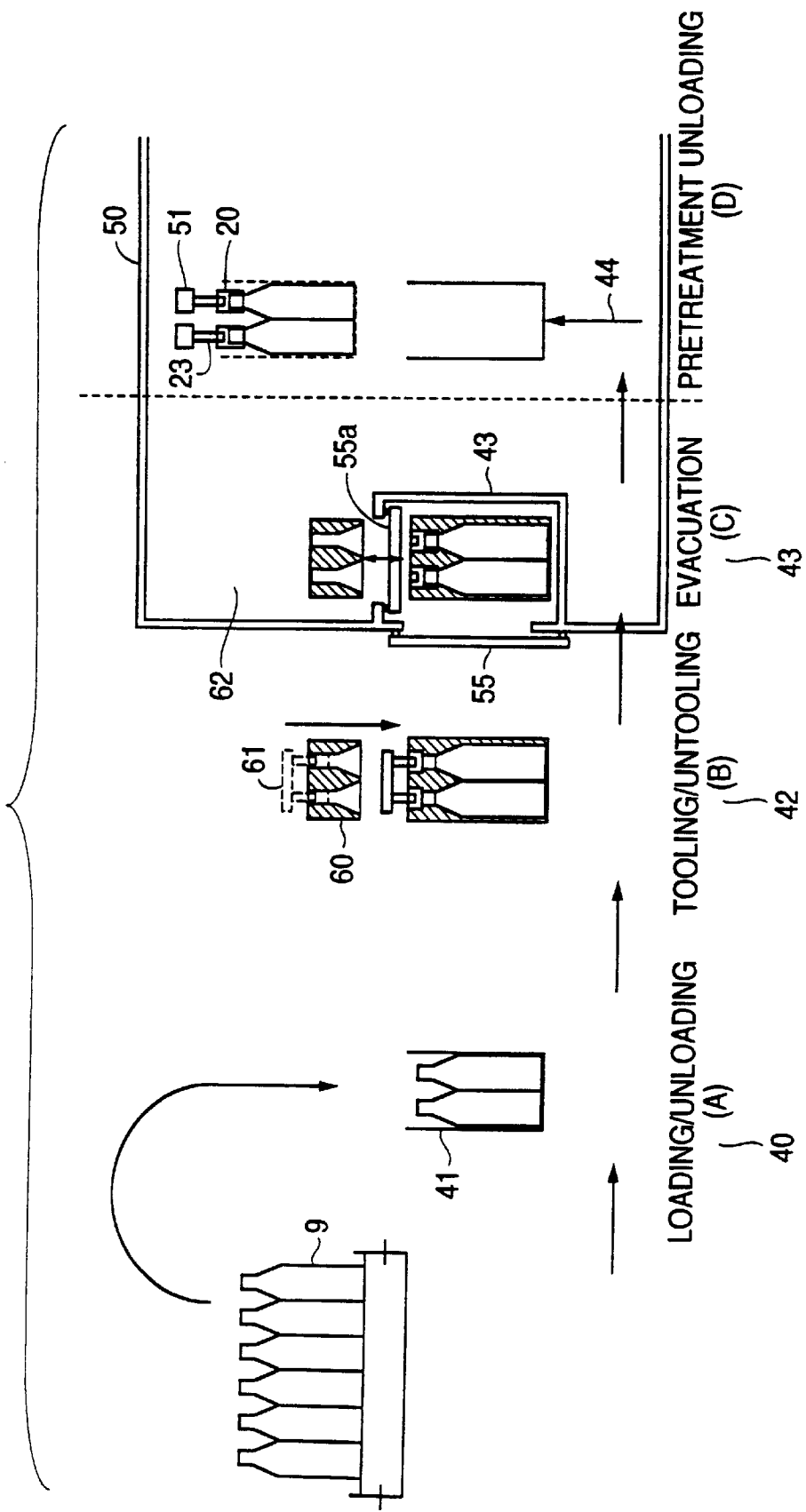

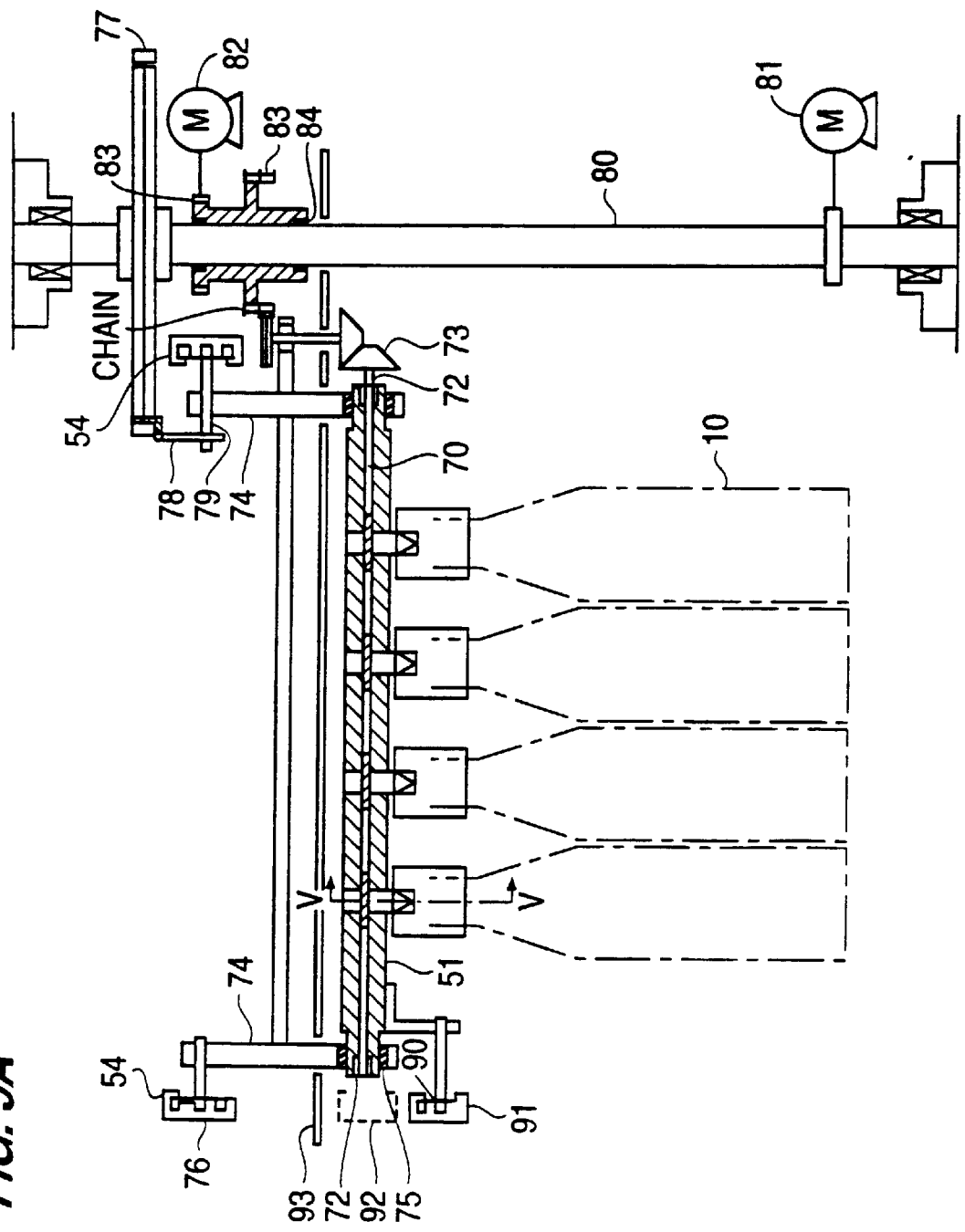
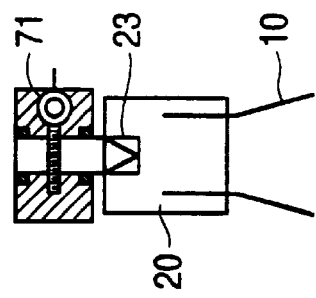
FIG. 5A
FIG. 5B

Non-Refillable PET Bottle Surface

Shows Typical Cyclictrimer Formation on Bottle Surface after Several Weeks

Refillable PET Bottle Surface

Shows Typical Cyclictrimer Formation on Bottle Surface After Several Weeks

Non-Refillable PET Bottle Surface

Shows Surface of Fresh (less than 3 hours) PET Bottle - Little or No Cyclictrimer Non-Refillable PET Bottle Surface Same View but at 1/2 Magnification (10,000 times)

Plasmarized Non-Refillable PET Bottles

TCCC Coated Bottles with Zn + Cu Ions Scratched with a Pin to
Demonstrate Adhesion - Bottle has been Pressurized Same View but at 4 Times Magnification (20,000 times)

Plasmarized Non-Refillable PET Bottles

Competitive Process (VTD) not Scratched, but Showing Peeling and Removal from Poor Adhesion - Bottle has been Pressurized Similar View but at 100 Times Magnification

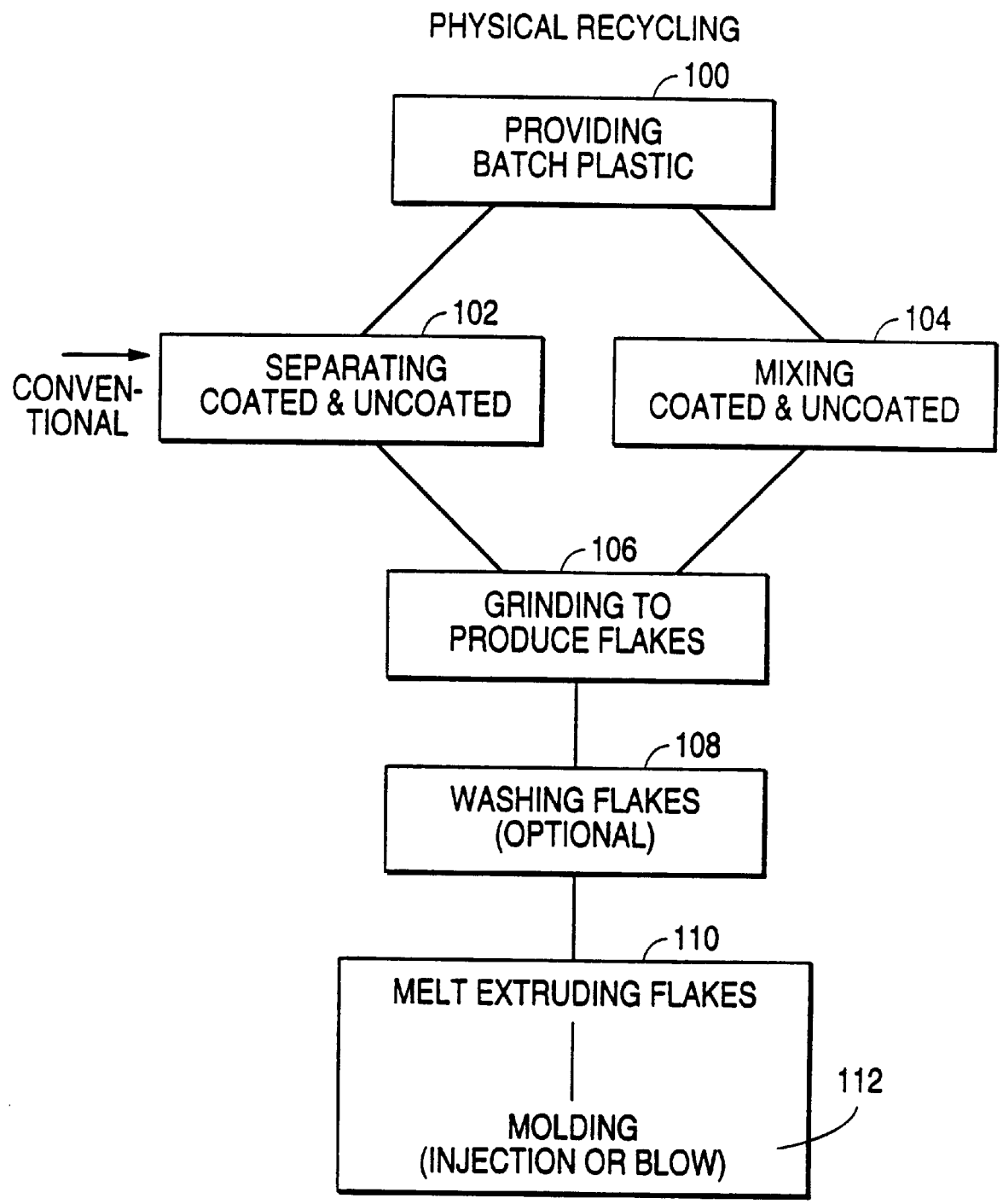

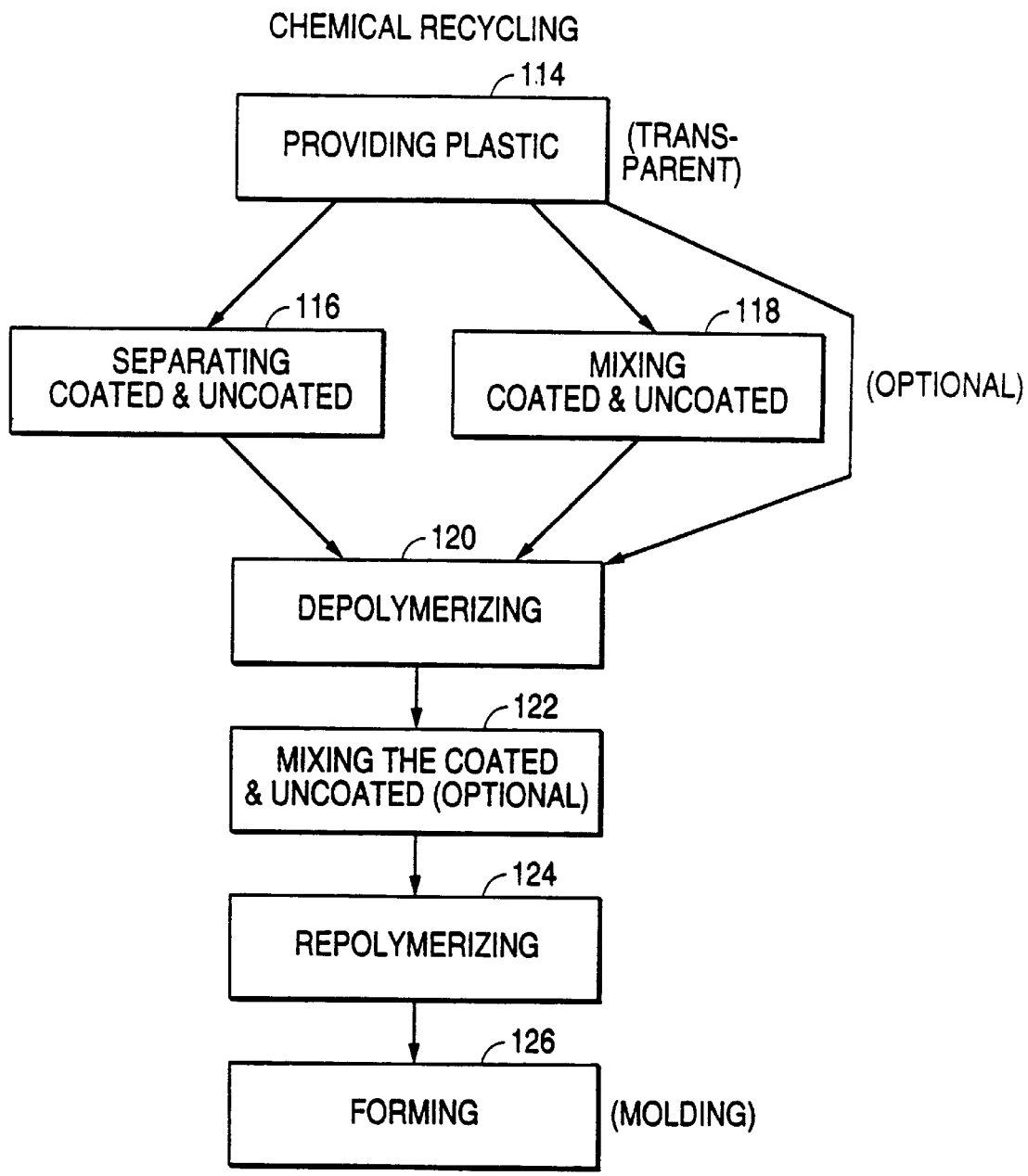

HOLLOW PLASTIC CONTAINERS WITH AN EXTERNAL VERY THIN COATING OF LOW PERMEABILITY TO GASES AND VAPORS THROUGH PLASMA-ASSISTED DEPOSITION OF INORGANIC SUBSTANCES AND METHOD AND SYSTEM FOR MAKING THE COATING

BACKGROUND OF THE INVENTION

This invention relates to pressurized plastic containers that have enhanced barrier performance and methods to provide said containers and to the coatings. The enhanced barrier performance is obtained by application of inorganic coatings to the external surface of the container. The coatings exhibit enhanced adhesion relative to prior art coatings.

DESCRIPTION OF THE BACKGROUND ART

Plastic containers currently comprise a large and growing segment of the food and beverage industry. Plastic containers offer a number of advantages over traditional metal and glass containers. They are lightweight, inexpensive, nonbreakable, transparent and easily manufactured and handled. However, plastic containers have at least one significant drawback that has limited their universal acceptance, especially in the more demanding food applications. That drawback is that all plastic containers are more or less permeable to water, oxygen, carbon dioxide, and other gases and vapors. In a number of applications, the permeation rates of affordable plastics are great enough to significantly limit the shelf-life of the contained food or beverage, or prevent the use of plastic containers altogether. Shelf-life is the time needed for a loss of seventeen percent of the initial carbonation of a beverage.

It has been recognized for some time that a container structure that combines the best features of plastic containers and more traditional containers could be obtained by applying a glass-like or metal-like layer to a plastic container, and metallized plastic containers. For example, metallized potato chip bags have been commercially available for some time. However, in a number of applications, the clarity of the package is of significant importance, and for those applications metallized coatings are not acceptable. obtaining durable glass-like coatings on plastic containers without changing the appearance of the container has proven to be much more difficult.

A number of processes have been developed for the purpose of applying glass-like coatings onto plastic films, where the films are then subsequently formed into flexible plastic containers. However, relatively few processes have been developed that allow the application of a glass-like coating onto a preformed, relatively rigid plastic container such as the PET bottles commonly used in the U.S. for carbonated beverages, and heretofore no process has been developed that allows the application of a glass-like coating onto the external surface of a plastic container that is sufficiently durable to withstand the effect of pressurization of the container, retain an enhanced barrier to gases and vapors subsequent to said pressurization, and not affect the recyclability of the containers. Pressurized beverage containers currently comprise a very large market world-wide, and currently affordable plastics have sufficiently high permeation rates to limit the use of plastic containers in a number of the markets served.

Such pressurized containers include plastic bottles for both carbonated and non-carbonated beverages. Plastic bottles have been constructed from various polymers, predominant among them being polyethylene terephthalate (PET), particularly for carbonated beverages, but all of these polymers have exhibited various degrees of permeability to gases and vapors which have limited the shelf life of the beverages placed within them. For example, carbonated beverage bottles have a shelf-life which is limited by loss of $CO_2$. While this limitation becomes increasingly important as the size of the bottle is reduced, because of the increasing surface to volume ratio, small containers are needed for many market applications, and this severely limits the use of plastic bottles in such cases. Generally, based upon this surface to volume ratio, as a bottle becomes smaller, carbonation retention in the beverage becomes more difficult.

For non-carbonated beverages, similar limitations apply, again with increasing importance as the bottle size is reduced, on account of oxygen and/or water-vapor diffusion. It should be appreciated that diffusion means both ingress and egress (diffusion and infusion) to and from the bottle or container. The degree of impermeability (described herein as "gas barrier") to $CO_2$ diffusion and to the diffusion of oxygen, water vapor and other gases, grows in importance in conditions of high ambient temperature. An outer coating with high gas barrier can improve the quality of beverages packed in plastic bottles and increase the shelf life of such bottles, making small bottles feasible, and this in turn presents many advantages in reduced distribution costs and a more flexible marketing mix.

Some polymers, for example PET, are also susceptible to stress cracking when they come in contact with bottle-conveyor lubricants used in bottle filling plants, or detergents, solvents and other materials. Such cracking is often described as "environmental stress cracking" and can limit the life of the bottle by causing leaks and prevent damage to adjacent property. An impermeable outer surface for plastic bottles, and prevent damage to adjacent property which resists stress-cracking-inducing chemicals, will extend the shelf life of plastic bottles in some markets.

Another limitation to shelf life and beverage quality is often UV radiation which can affect the taste, color and other beverage properties. This is particularly important in conditions of prolonged sunshine. An outer coating with UV absorbing properties can improve the quality of such beverages and make plastic bottles much more useable under such conditions.

Additional functionality can be incorporated into the inorganic coating by incorporating visible light absorbing species, rendering the plastic container cosmetically more appealing.

An additional benefit of the present invention is ease of recycling. Prior art barrier enhancing coatings generally are organic in nature and are much thicker than the coating of the present invention. Consequently, when post-consumer scrap containing containers coated with prior art organic coatings are recycled, significant deterioration in the appearance and properties of the plastic occur. In contrast, because of the inert nature and thinness of the coatings of the present invention, the coated containers can be processed in any conventional recycling system without modification of the process.

Moreover, haziness in recycled articles can occur when large sized particles are used in a coating. However, such a haze is avoided in the present invention because relatively small particles are used as will be described. Moreover, the coating is acceptable for food contact and therefore will not adversely affect the recycling effort when ground or depolymorized in the recycling process.

Along the lines of recycling, the present invention provides for a method of recycling coated plastic which has results heretofore unattainable. In particular, separation of coated and uncoated plastics is unnecessary whereby modifications to existing recycling systems are unnecessary or whereby extra process steps (separating coated bottles from uncoated bottles) can be avoided. Moreover, it is possible to produce a transparent plastic from coated plastic while avoiding the above-noted problem of haziness in the final recycled product. While the present invention can be used in recycling many types of plastic, it is contemplated that this invention can be used with plastic articles, such as containers or bottles and more particularly, with plastic beverage bottles. Bottle-to-bottle recycling remains unaffected with the present invention.

Recycling in the instant invention can be carried out in both a chemical process and a physical process. The plastic subjected to recycling processes can be molded or extruded. Even if a coated plastic is initially introduced in the recycling process, the coating of the present invention will not interfere with the downstream injection molding or blow molding.

Finally, the cost of applying a coating to the outside of a bottle, which has a gas barrier which significantly increases the shelf-life of beverage container in that bottle, and/or which significantly reduces product spoilage of beverage container in that bottle, and/or which significantly reduces product spoilage due to UV radiation, and/or virtually eliminates environmental stress cracking, and/or provides a specific color, must not add significant cost to the basic package. This is a criterion, which eliminates many processes for high gas barrier coatings, because plastic bottles are themselves a very low cost, mass produced article. Affordability implies in practice that the cost of the coating must add minimal or no increase to the cost of the whole package and in fact, the cost can be less.

A coating on the outside of plastic bottles must be capable of flexing. When bottles are used for pressurized containers, the coating preferably should be able to biaxially stretch whenever the plastic substrate stretches. In addition it is preferable that the coating be continuous over the majority of the container surface. However, in the present invention, unlike prior art devices, the continuous coating is not essential because of the high level of adhesion of the inorganic coating to the surface of the plastic container. In other words, even though the coating of the present invention may be non-continuous because of scratches or fractures therein, for example, the coating will continue to effectively adhere to the substrate such as an underlying plastic bottle. The present invention can therefore provide an effective gas barrier even if the surface is highly fractured. A high gas barrier of 1.25×greater than a similar uncoated container can be obtained with the present invention and this barrier can even be 1.5× or preferably 2×greater.

Adhesion is particularly important in the case of carbonated beverages, since the $CO_2$ within the bottle exerts some or all of its in-bottle pressure on the coating. This pressure can rise to above 6 bar, exerting considerable forces on the coating/plastic interface. The coating must also resist scuffing, normal handling, weathering (rain, sun climate, etc.), and the coating must maintain its gas barrier throughout the bottle's useful life.

There are several plasma-enhanced processes which apply an external, inorganic coating to a range of articles, which in some cases includes bottles. Many of the processes are targeted to provide coating properties which are quite different, and far less onerous than high gas barrier bottle coatings. Such processes target, for example, abrasion resistance, where the coating continuity is not a major factor, since the coating can protect the microscopic interstices. Other processes target cosmetic or light-reflection properties and some processes have a pure handling protection role. Often the substrate does not flex nor stretch and the article itself is higher priced than plastic bottles so that cost is not a benefit of the design. In some cases, the substrate allows far higher coating temperatures than those allowed by PET, the most common plastic-bottle material. Such processes do not, in general, provide the coating continuity, adhesion, flexibility needed for high gas barrier coatings, nor do they provide a solution to the other problems relating to high gas barrier coatings, described above.

Prior art also exists for gas barrier processes for bottles, but the lack of commercially available, coated bottles for pressurized application is due to the fact that these processes lack the desirable attributes described above and fail to provide a coating with adequate adhesion, continuity and/or flexibility under high in-bottle pressure or a coating which avoids recycling problems, or the low cost necessary to make the coating affordable.

U.S. Pat. No. 5,565,248 to Plester and Ehrich describes a method for coating containers internally. However, external coatings require far greater adhesion than internal coatings, because in-bottle pressure acts against external coatings, and internal coatings are not subject to the same handling and/or abrasion in use. For these, and other reasons, coating bottles externally differs from coating them internally and the present invention is therefore substantially different.

SUMMARY OF THE INVENTION

Accordingly, it is an object of the present invention to provide an outer coating or layer for a container such as a heat sensitive plastic bottle, and particularly for the non-refillable bottles used for carbonated beverages.

It is a further object of the present invention to provide a coating and a system and method for coating which can provide an external glass-like coating that is flexible, durable and possess sufficient adhesion to withstand the effects of pressurization without significant loss of enhanced barrier properties.

An additional object of the present invention is to provide an externally coated container which will avoid environmental stress cracking such as when the container comes into contact with conveyor lubricants during filling, detergent, cleaners or solvents or similar substances during its life cycle. Such lubricants can include 409™, Mean Green™ or other commercially available cleansers or lubricants, etc.

Yet another object of the present invention is to provide a lighter container and a system and method for making the container whereby an amount of plastic utilized in making the container as compared to a conventional container can be reduced without adversely effecting or while improving the gas barrier effectiveness of the container.

It is another object of the present invention to provide a coating that comprises an inorganic oxide layer on the external surface of a plastic container, the inorganic oxide layer being further distinguished by being comprised of greater than or equal to 50 and up to but less than 100% $SiO_x$ ($x=1.7$ to $2.0$).

Another object is to provide a coating which possesses sufficient adhesion to the external surface of the plastic container so that the barrier enhancement provided by the inorganic oxide layer is not substantially reduced upon pressurization of the container to a pressure between 1 and 100 psig.

A further object of the present invention is to provide a method for applying an inorganic layer as described above, the method resulting in a robust inorganic oxide layer that provides an effective level of barrier enhancement to the plastic container and does not result in significant physical distortion of the container.

It is a further object of the present invention to provide a system and method for manufacturing a container whereby the aesthetic appeal of the container will be enhanced by applying a colored inorganic layer that further contains visible-light absorbing species.

Yet another object of the present invention is to provide a coating for a container with UV absorbing capabilities.

Still another object of the present invention is to provide a container with a colored or clear coating which can easily be recycled without significant or abnormal complications to existing recycling systems.

Another object of the present invention is to provide a system and method for inexpensively manufacturing an externally coated container.

Yet another object of the present invention is to provide a method which the thickness and composition of the applied coating on a container can be rapidly and easily determined and whereby process control and insurance of enhanced barrier performance can be obtained.

A further object of the present invention is to provide a method to determine the condition of the surface of a plastic container at least with regards to its suitability for applying glass-like coatings.

Another object of the present invention is to provide a high gas barrier which considerably increases the shelf life of the containers such as plastic bottles and to provide the containers with good transparency so as not to affect the appearance of a clear plastic bottle.

Yet another object of the present invention is to provide a container with enhanced barrier performance both when the container walls flex or stretch under pressure and when the walls are indented.

Still another object of the present invention is to provide a container with adequate durability and adhesion during working life, when the outer surface of the container is subjected to environmental conditions such as severe weather, rubbing, scuffing, or abrasions (for example, during transportation) or when the outer coating is subjected to internal pressure and with the ability to maintain a gas barrier while remaining stressed by in-bottle pressure throughout the container's useful life.

Also, another object of the present invention includes the ability to enable coating to heat sensitive plastic containers with coating materials, which can only be vaporized at very high temperatures without an acceptable increase in the plastic's temperature and which must remain in many cases below 60° C.

The foregoing and other objects of this invention are fulfilled by a method, apparatus and process control procedure for plasma-assisted deposition of a very thin, typically 10–100 nm, inorganic outer surface coating on a container such as a plastic bottle using inorganic substances.

Although not bound to any particular theory, the formation of a highly adherent, dense, continuous coating may be achieved in the present invention by producing a high energy plasma which further provides good coating adhesion by enabling penetration of the coating beneath the surface of the plastic. This penetration is additionally assisted by a biasing energy using RF or HF. Formation of a dense coating is further enhanced by the ability to coat under conditions of high vacuum (generally in range $10^{-3}$ to $10^{-5}$ mbar) which avoids unwanted gas molecules being incorporated into the coating and is still further enhanced by the ability to cause the reaction components of the coating to react stoichiometrically.

Furthermore, the method described herein enables surface pretreatment for the activation of the plastic surface by forming free radicals which can react with and attach to the coating and enhance adhesion before coating begins. The method further includes surface cleaning, where necessary. The method identifies the need to apply surface activation during pretreatment, and to control this, since activation can be counter productive by damaging the surface. The method also describes means of inspecting the bottle surface for coating suitability and identifies factors which lead to the preference to coat containers (particularly PET bottles) quickly, or immediately, after molding. The method describes means of degassing the plastic, so as to avoid vapor emission from the plastic surface which interferes with the coating, and reduces its adhesion or density.

The form of deposition provides for an approach angle of plasma particles to the surface which does not exceed 70° to the vertical, so as to enhance coating adhesion. It also provides for mixtures of substances to be deposited, and particularly for the trace of addition (up to 50%) of metal ions into silica, which increases silica's gas barrier for pressurized packages. The form of deposition also enables heat sensitive containers to be coated without significant temperature rise, and at all times maintaining a bottle temperature well below 60° C.

While this angle of 70° to the vertical was noted above, it is important to recognize that there may be certain situations where this limitation would not apply. For example, if bottles or containers surrounded a vapor source, then no limitation on the angle would be desired. In other words, plasma particles could be moving 360° from their source if the bottles or containers to be coated surrounded the source. Alternatively, if two parallel conveyors were provided for moving the bottles or containers past a given source with the source being between the conveyor lines, then plasma particles could also move 360° from this source in order to reach the bottles or containers on both conveyor lines. Other situations are envisioned whereby the angle would not be limited to 70°.

The method enables mixtures and layers of substances to be applied which can be chosen for their color, or UV-absorbing properties, or additional gas barrier properties. Further, the method enables coatings, such as silica, which are fully transparent and clear, and would therefore not affect the appearance of an otherwise clear bottle. The coating materials are inert and remain solid when the plastic bottle is melted for recycling.

The method for coating the outer surface of a container according to the present invention comprises the steps of (1) conveying the containers to a loading/unloading station where they are placed into a holding crate ("holder"); (b) conveying the holder/containers into a "tool" station which applies in-bottle antennas and seals the containers with caps, which enable the inside of the container to stay under pressure during coating and provide for the containers to be gripped, rotated and released at the appropriate parts of the coating cycle; (c) locating holder/containers in an evacuation cell which brings the holder/containers to the pressure of a vacuum cell; (d) conveying holder/containers into the vacuum cell to a container loading/unloading table and raising holder/bottles to permit the containers to be gripped and located in a conveyor chain; (3) conveying containers while continuously rotating them in a vertical position within the vacuum cell through stages, which enable degassing of plastic, then pretreatment to clean/activate the container surface, then container base coating; (f) conveying containers while continuously rotating them in a horizontal position within the vacuum cell to enable the container sidewall to be coated; (g) returning the coated containers to the container loading/unloading table where they are replaced in the holder; (h) returning holder/containers to the evacuation cell where they are brought back to normal atmospheric pressure; (i) conveying the holder/containers to the "tool" station where the antennas and caps are removed; (j) conveying holder/containers to the container loading/unloading station where the coated containers are removed from holder and replaced by uncoated containers so that the cycle can be repeated.

Within the vacuum cells, a plasma at very low pressures is created using a conventional electron gun. While the gun itself is known, the method of using this gun in the present invention is new as will be described below. Trace metals can be added to a silica coating by sacrificial erosion of the electron gun. The solid deposit will stoichiometrically and on-surface react with the reactive gas to ensure that surplus gas molecules cannot be build into the coating, thus avoiding porosity. The coating is at high vacuum to reduce interference of ambient gas molecules with the coating process and to avoid gas molecules being built into the coating, causing porosity. A very thin coating, generally below 100 nm is deposited on the container. Optionally, RF and HF energy is used to bias the coating particles and an in-cell antenna and RF or HF or DC energy is optionally used to create a pretreatment plasma within the vacuum cell. The plastic container is degassed to avoid vapor emerging from the plastic which can interfere with the coating process. Multiple plasma-making systems can be used whenever more than one solid material is needed for the coating process.

An apparatus for performing the above-mentioned method steps comprises: (a) a holder and means of loading containers into it; (b) a cap which seals the container opening and which incorporates a screw driver-type slot and quick-snap-in-release connection for gripping, releasing and turning the containers; (c) an antenna which can be erected inside the container, maintain a minimal gap with the walls of the container without touching the walls, and can be orientated to face in the desired direction either magnetically or by gravity; (d) means of inserting antenna into the containers and applying the cap; (e) means of sealing holder/containers in a cell which can either be pumped down to coating pressure so as to enable the holder/containers to enter the vacuum cell, or can be repressurized to enable holder/containers to exit the vacuum call; (f) means of conveying holder/containers into the vacuum cell and means for gripping the containers in a conveyor system which runs within the vacuum cell; (g) a vacuum cell with an internal conveying system which conveys the containers, while continuously rotating them, first in vertical position, then in horizontal position; (h) a plasma-making system having a conventional electron-gun and coating-materials that are to be deposited; (i) a biasing system using RF or HF energy and applying it to the in-container antenna, and use of this system both for pretreatment and for densifying the coating by biasing the coating particles; (j) an optional in-vacuum cell mounted antenna which can create a pretreatment plasma by using RF or HF or DC energy; and (k) means of introducing a gas or mixture of gases into the vacuum cell.

These and other objects of the present invention are fulfilled by a system for coating an external surface of a container wherein the container on pressurization possess a gas barrier at least 1.25×greater than a similar uncoated container, the system comprising:

a vacuum cell, pressure within the vacuum cell being reduced as compared to ambient pressure;

means for supplying containers to and withdrawing containers from the vacuum cell; and at least one source for supplying a coating vapor to the external surface of the containers in the vacuum cell, the coating vapor from the at least one source depositing a relatively thin coating on the external surface of the containers, whereby bonding between at least a portion of the relatively thin coating deposited on the container and the external surface of the container occurs.

Moreover, these and other objects of the present invention are fulfilled by a system for coating an external surface of a container wherein the container on pressurization has enhanced environmental stress crack resistance, the system comprising:

a vacuum cell, pressure within the vacuum cell being reduced as compared to ambient pressure;

means for supplying containers to and withdrawing containers from the vacuum cell; and at least one source for supplying a coating vapor to the external surface of the containers in the vacuum cell, the coating vapor from the at least one source depositing a relatively thin coating on the external surface of the containers, whereby bonding between at least a portion of the relatively thin coating deposited on the container and the external surface of the container occurs.

In addition, these and other objects of the present invention are fulfilled by a plastic container having an inorganic oxide coating on an external surface thereof, the coated plastic container possessing a gas barrier of at least 1.25× after pressurization as compared to a similarly pressurized uncoated container.

These and other objects of the present invention are also fulfilled by a method for coating a plastic container comprising the steps of:

introducing said container into a vacuum cell;

applying an inorganic composition to an external surface of the container in the presence of at least one reactive gas and at sub-atmospheric pressure; and removing the container from the vacuum cell.

In addition, these and other objects of the present invention are fulfilled by a method for producing recycled content plastic comprising the steps of:

providing a batch plastic, at least a portion of the plastic having a coating thereon;

grinding the plastic to produce flakes; and melt extruding the flakes.

A method for producing recycled content plastic fulfills these and other objects of the present invention with the steps of:

providing at least some coated plastic;

depolymerizing said at least some coated plastic; and re-polymerizing said depolymerized plastic.

Moreover, these and other objects of the present invention are fulfilled by a plastic container having an exterior inorganic coating that has an equivalent gas barrier and reduced weight compared to a plastic container of similar surface area and volume and without said exterior inorganic coating.

In addition, these and other objects of the present invention are fulfilled by a method of extending shelf life of a plastic container comprising the steps of:

providing a plastic container, the plastic container having an inorganic coating on an external surface thereof;

filling the plastic container with a pressurized beverage;

sealing the plastic container after the step of filling;

preventing escape of pressurized gas from the plastic container, the coating being utilized in prevention of escape of the pressurized gas;

holding the pressurized gas within the container for a longer time period than a similarly sized and shaped container without the inorganic coating, the inorganic coating being utilized in the holding of the pressurized gas; and permitting at least one of flexing and stretching of the inorganic coating without substantially affecting the step of holding.

Still yet these and other objects of the present invention are fulfilled by a device for coating containers, the device comprising:

an electron gun;

a receptacle for holding material, the electron gun vaporizing at least a portion of the material held in the receptacle; and means for conveying containers through an area having vapor produced by the electron gun vaporizing the material, the vapor being deposited on the containers to thereby coat an exterior of the containers.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will be more readily understood from the detailed description given hereinbelow and the accompanying drawings, which are given by way of illustration only and thus are not limitative of the present invention, and wherein:

FIG. 4 shows the handling of bottles, holder, caps, antennas, air-displacing collars of the present invention;

FIG. 5A shows a system for conveying bottles first vertically, then horizontally while bottles are continuously rotated;

FIG. 5B shows a sectional view of the bottle bar taken along line V—V of FIG. 5A;

FIG. 10 is a flow chart illustrating the steps of physical recycling; and

FIG. 11 is a flow chart illustrating the steps of chemical recycling.

DETAILED DESCRIPTION OF THE PREFERRED EMBODIMENTS

Coatings with good adhesion to a surface of a container, good gas barriers, and providing the necessary stretchability and flexibility can be produced by the process and systems of the present invention. Throughout the present specification, a container or bottle 10 will be described. While this container will generally be described with reference to a plastic bottle, any suitable container can be treated by the method and system of the present invention. Accordingly, soft drink bottles of various sizes, other food containers or any other suitable container can be treated using the disclosed method and system.

Figure 1:
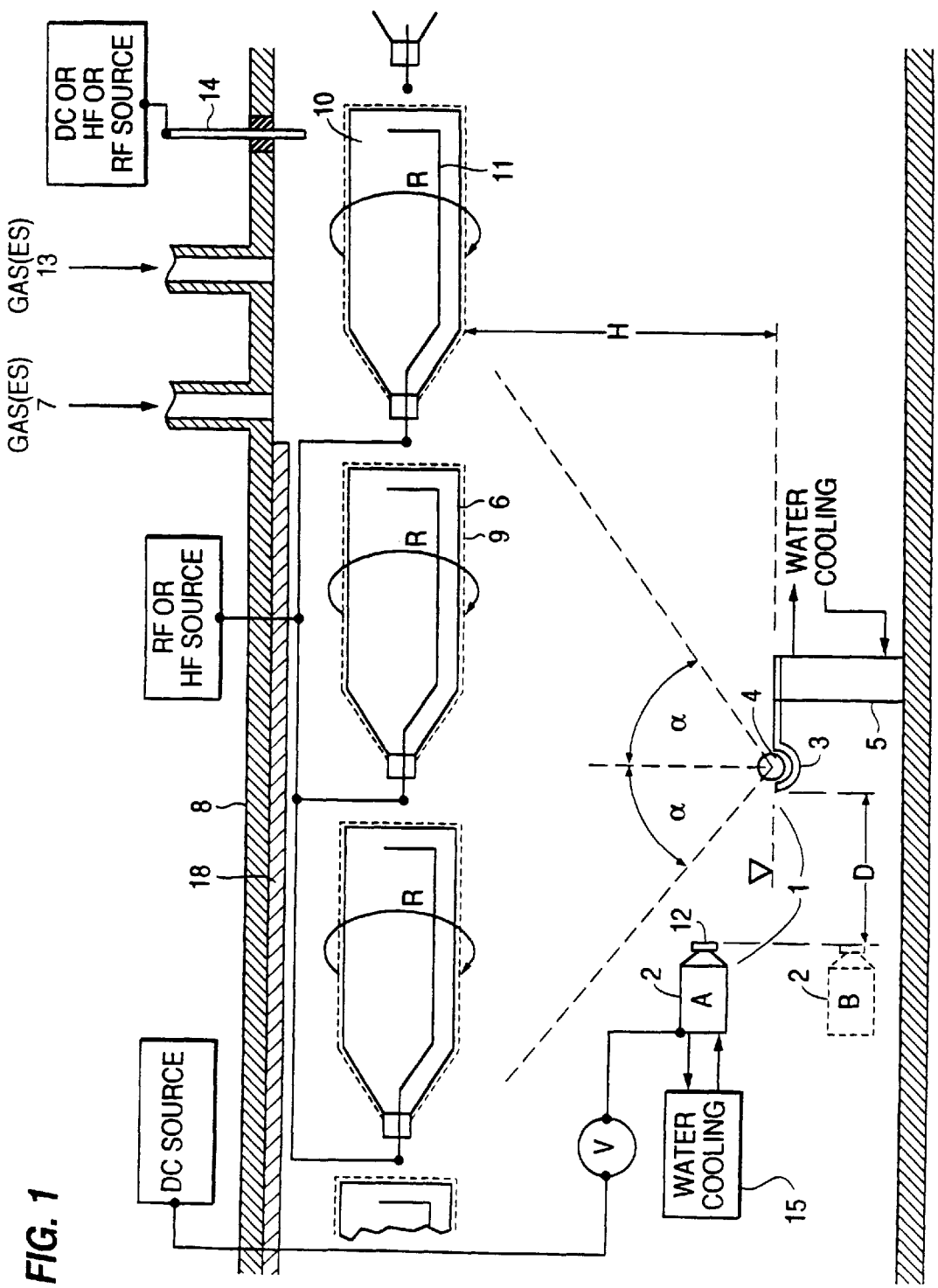
FIG. 1 is a schematic illustration of the basic process and it parameters.

FIG. 1 shows a source 1 used as typical evaporation and plasma-making system for this present invention. A conventional, water-cooled electron gun 2 is used to convey energy to a conventional receptacle 3, which holds the coating solids 4. This receptacle 3 is constructed of a material suitable for melting and evaporating the particular coating solid chosen, and must be both inert and resistant to the temperature necessary for generating the quantities of vapor needed. For example, for evaporating silicon, carbon has been found to be a suitable material. The receptacle 3 is suspended from a receptacle holder 5, which is water cooled or cooled by other methods.

By using these conventional components (i.e., electron gun 2 and receptacle 3, and by varying the position of the electron gun 2 relative to the horizontal surface of the receptacle 3, the proportion of energy available for plasma-making and evaporation can be adjusted. For example, in position A, a large portion of the energy is available for plasma-making, while in position B, almost all energy is used for evaporation and hardly any plasma is formed. The degree of energy to the source 1 is adjusted by the voltage V to give the particular deposition rate on the external bottle surface 6 which enables coating solids 4, after evaporation, to deposit and react completely (i.e., stoichiometrically) with the gaseous substance 7 (or mixture of substances) introduced into the coating chamber 8, thus ensuring that no significant amounts of unreacted gas can be occluded within the coating 9. For example, in one of the preferred embodiments, which uses silicon as coating solid 4 and oxygen as gaseous substance 7, deposition rates onto the coating surface of 2 to 20 nm/s can give fully transparent coatings, with virtually x=2 in $SiO_x$, while avoiding surplus oxygen (or air) and maintaining high vacuum in the coating cell (in region of $10^5$ mbar to $10^3$ mbar).

For producing good gas barrier results, it is beneficial to ensure that an on-surface reaction between coating solids 4 and gaseous substance 7 takes place after coating solids 4 have been deposited and formed a solid lattice, since the gaseous substance 7 then densities the coating 9 by reacting into the solid lattice. The distance H between a surface 6 of a container 10 and the receptacle 3 is important when avoiding the coating solids 4 which react with the gaseous substance 7 before the coating solids 4 are deposited onto the container surface 6. Equally, the condition of the coating solids 4 is important in securing maximum on-surface reaction. When these coating solids 4 are to be oxidized on the container surface 6, as in case of silicon, large chunks with low oxidized surface areas give best results. A distance H is chosen so as to give optimal use of source 1 (thus enabling it to coat as many bottles 10 as possible) while at the same time providing a collision-free path (thus limiting reaction prior to the container surface 6). Distance H is dependent on vacuum and deposition rate, but generally in region 0.3 m to 1 m. Also, increasing distance H, within the limitations described, enables high-energy plasmas to be created at source 1 without heat-damaging the container 10.

It is usually important to ensure that the individual particles of the coating solids 4 strike the container surface 6 at high speed and temperature, so that the first molecular layers of coating 9 break into container surface 6 thus forming an embedded foundation for the coating 9, which in turn helps the adhesion of the coating to the container 10 and the coating's flexibility, stretchability and resistance to the internal pressure generated with soft drink bottles, for example (which acts onto the bottle surface 6 and stresses the coating 9). High-energy plasma-generation (determined by position of electron gun 2, voltage V and distance between electron gun 2 and receptacle 3) is an important parameter, together with the coating angle α. A coating angle α in region 0–70° helps provide adequate adhesion, while angles above approximately 70° give poorer gas barrier results, since in such a case, the coating-solids 4 impinge at an angle to the surface which reduces surface impact.

Biasing energy, provided by locating an antenna 11 inside the bottle or container 10 and connecting it to an RF or HF source, also helps to improve the adhesion and density of coating 9 by accelerating and directing the ionized portion of the plasma toward the bottle surface 6. Depending on the material of bottle 10, biasing energies of up to 2000 V improve gas barrier, while normally these are in region 100–800 V. Excessive bias voltage can be detrimental by overheating and damaging the bottle surface 6. The antenna 11 must remain oriented in line with source 1 and means of achieving this, while bottle 10 rotates, are described below.

Rotation of bottle 10 enables the bottle 10 to be coated over its entire surface at a high rate of deposition of coating solids 4 while allowing time for reaction with gaseous substance(s) 7. When coating the sidewall, the rate of deposition of coating solids 4 onto the part of the surface of bottle 10, which is directly opposite source 1 and which is the only surface receiving significant deposition of coating solids 4, can be adjusted by rotating bottle 10 at an adequate rate, so that this deposition comprises only a few molecular layers. These molecular layers can be easily reacted with gaseous substance(s) 7, thus achieving the desired criterion of on-surface reaction with a solidified deposit, since this helps provide the required dense, continuous coating which gives good gas barrier. Also, since that part of the surface of bottle 10, which is not opposite source 1, can continue to react while not receiving deposition of coating solids 4, this procedure brings the whole 360° circumference of bottle 10 into the deposition/reaction cycle and reduces coating time. Therefore, correct setting of rotation rate (R) helps secure full reaction at optimal coating rate conditions. Conditions of high vacuum (e.g. $10^{-5}$ mbar to $10^{-3}$ mbar) and very thin coatings (usually below 100 nm) help to provide coatings which are continuous and exhibit no cracks, if stretched under pressure or flexed, when studied under high magnification using an scanning-electron microscope.

Small or trace additions of certain metals in silicon dioxide and other coatings can increase gas barrier. Such metals include Ag, Al, Ca, Cr, Cu, Fe, K, Mg, Mn, Na, Ni, Sn, Ti, and Zn, and are added to form a proportion of metal in coating 9 of 0.01 to 5%. For example, such additions to a coating 9 mainly composed of $SiO_2$ increase the gas barrier by a factor of 2, or more. Such metals are added either to receptacle 3, or are provided by the sacrificial erosion of the electron emitting plate or shield 12 of the electron gun 2, this being constructed out of the desired metal, or mixture of metals.

Figure 1A:
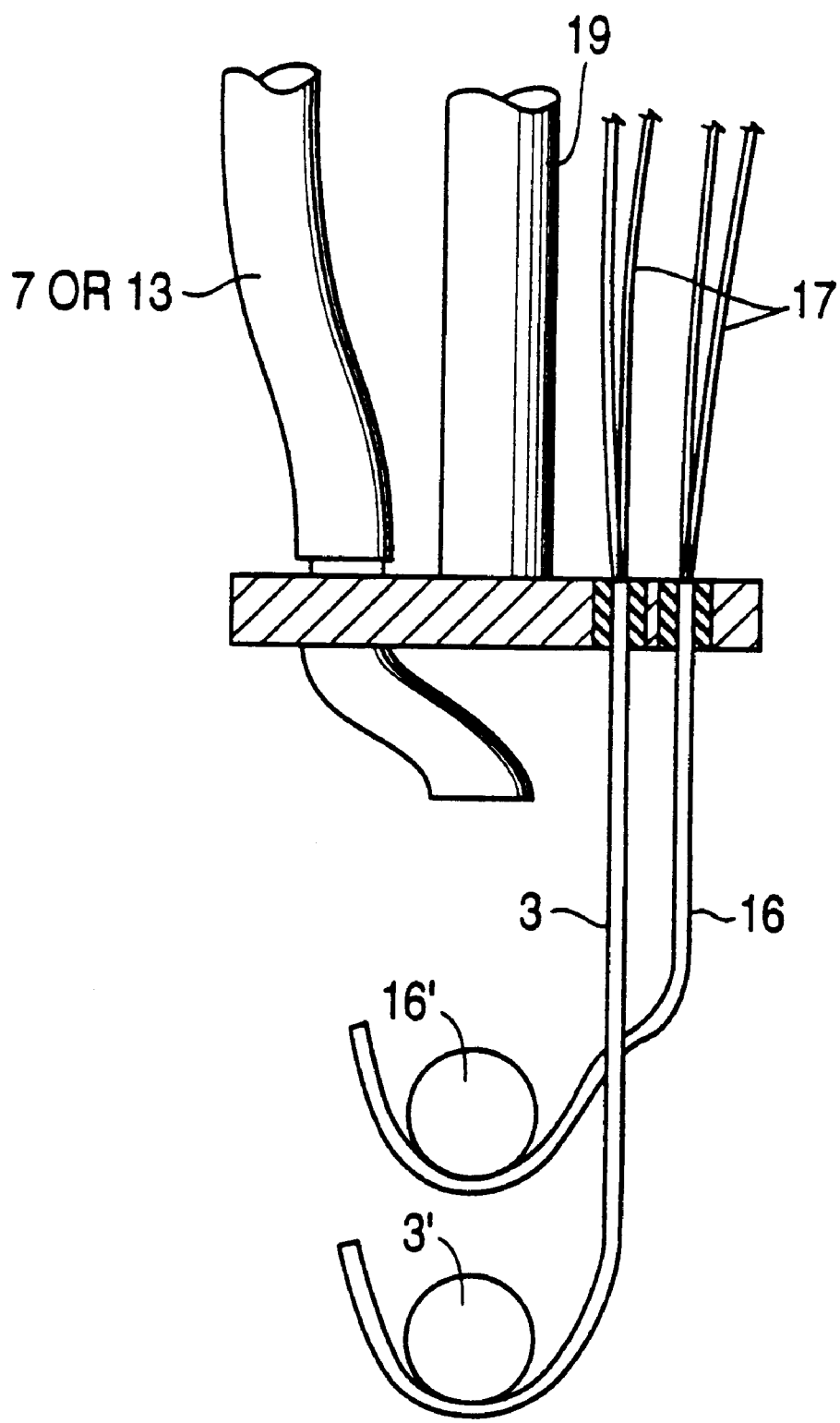
FIG. 1A is a schematic illustration similar to FIG. 1, but showing the receptacle 3 and a supplemental receptacle positioned on a support 19.

Alternatively, as shown in FIG. 1A, a separate receptacle 16 can be provided for holding a source 16' of metals. The receptacles 3 and 16 can be supported on the floor of the coating chamber 8 as shown in FIG. 1, or on a support 19 as shown in FIG. 1A or at any suitable location. The electron gun 2 can act on the materials 3', 16' in both respective receptacles 3, 16 or two separate electron guns can be provided. Also, the spacing between the receptacles 3, 16 can be relative close as shown in FIG. 1A or they can be further apart or the spacing can be varied.

Figure 1B:
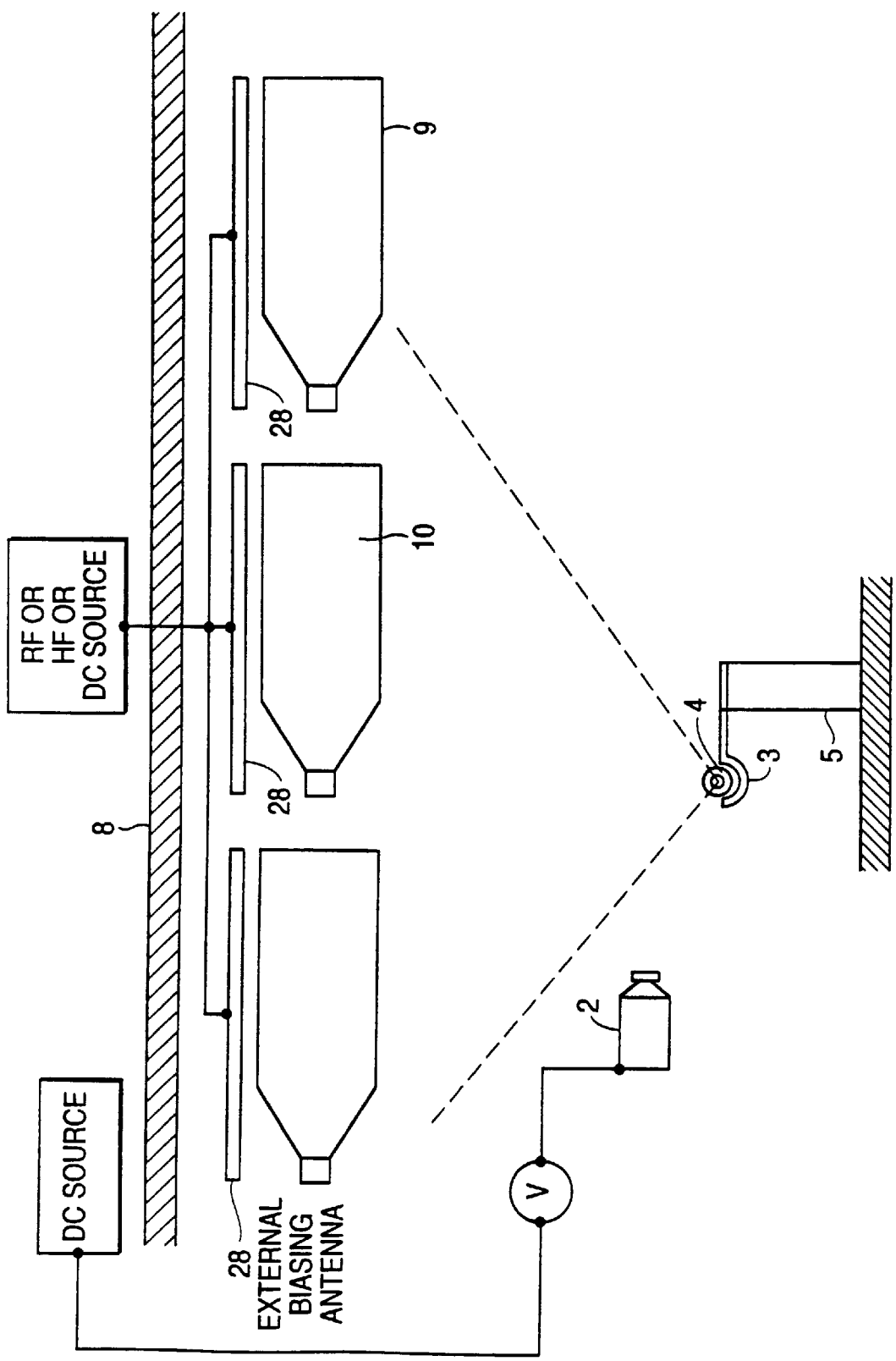
FIG. 1B is a schematic illustration similar to FIG. 1, but showing a modified form of the coating chamber.
Figure 2A:
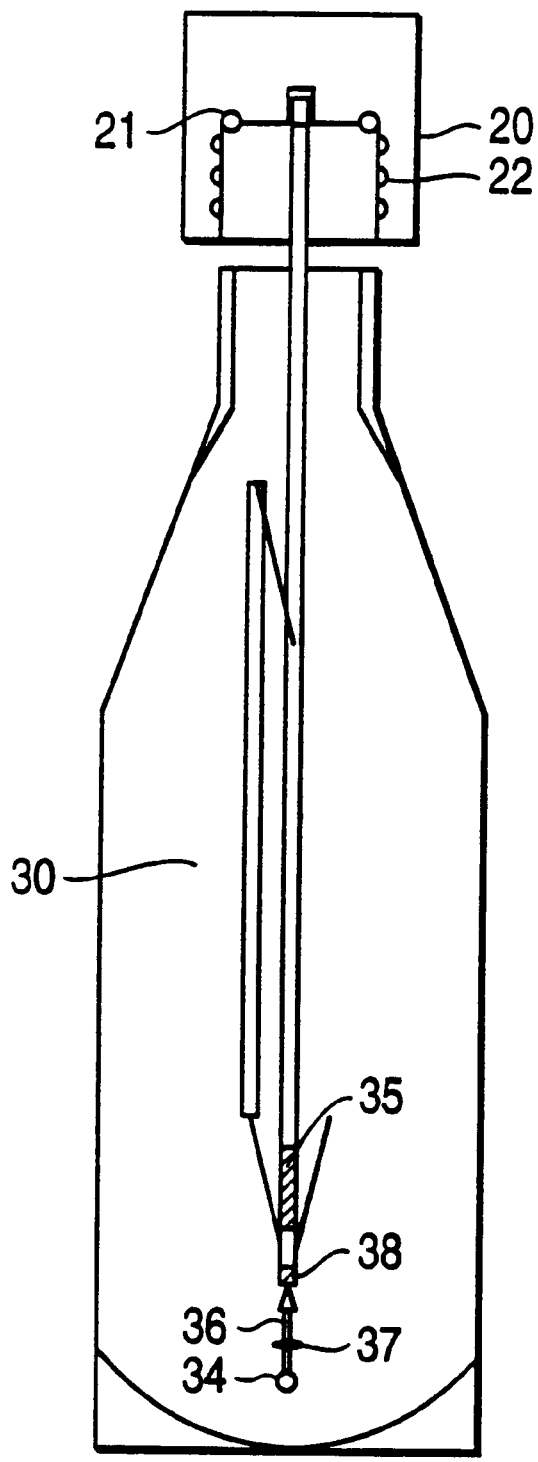
FIG. 2A shows the in-bottle antenna and bottle-capping arrangement before insertion of the antenna.
Figure 2B:
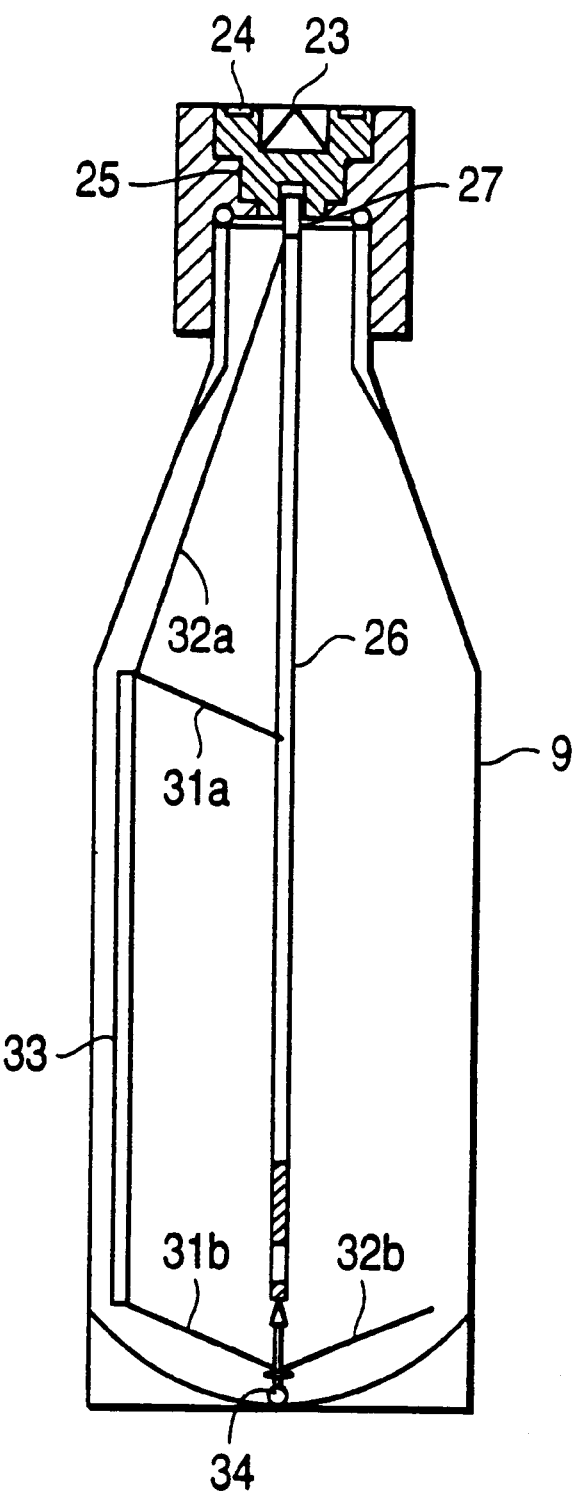
FIG. 2B shows a cross-section of the in-bottle antenna and bottle-capping arrangement of FIG. 2A after insertion of the antenna.
Figure 2C:
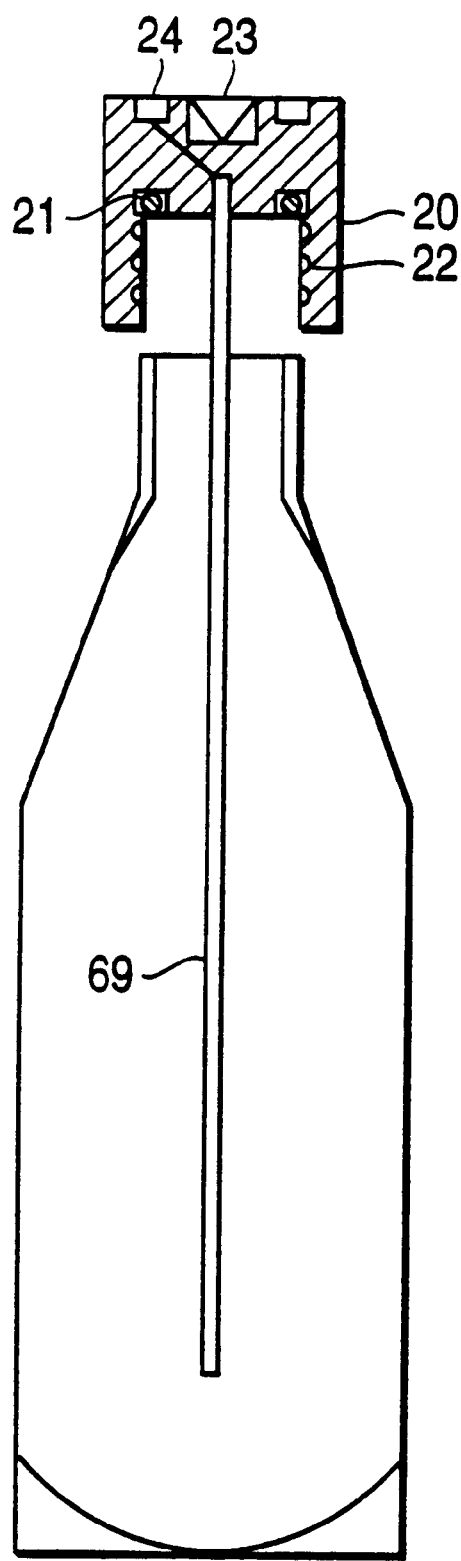
FIG. 2C is a cross-sectional view showing a modified form of an in-bottle antenna prior to insertion.
Figure 2D:
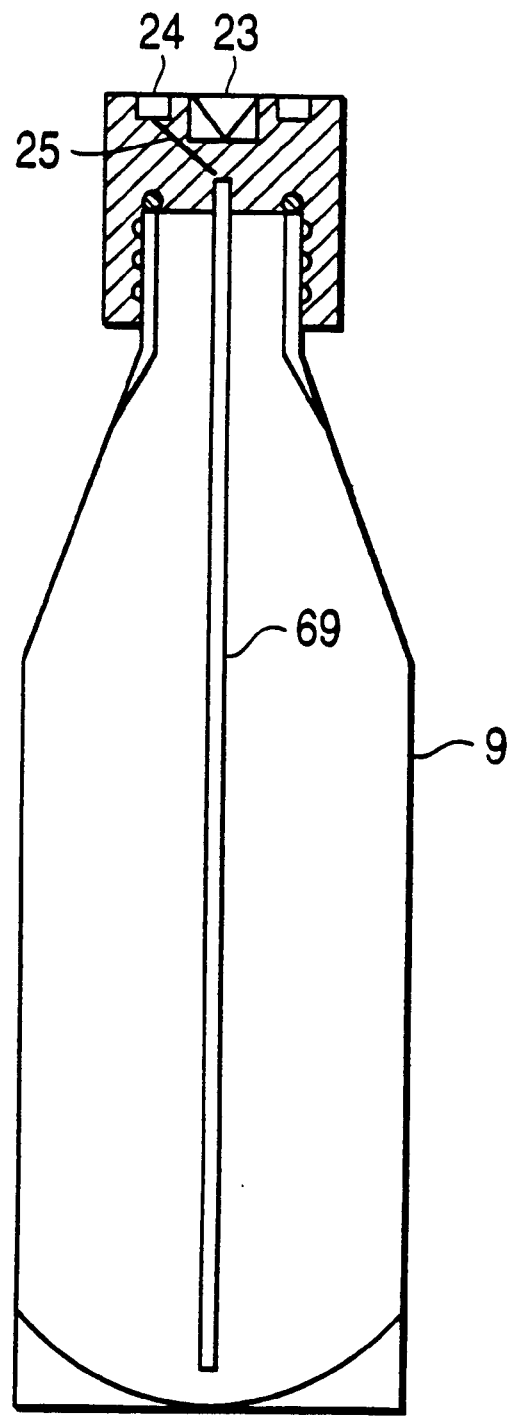
FIG. 2D is a cross-sectional view similar to FIG. 2C after insertion of the in-bottle antenna.

In FIG. 1B, an alternative embodiment of the coating chamber 8 is used. Instead of using in-bottle antennas 11 or coating cell antenna 14 or in addition to these antenna 11, 14, an external biasing antenna 28 is used. This antenna 28 is for biasing during coating. Of course, this is separate to the already shown out-of-bottle antenna 14 for pretreatment. While not indicated in FIG. 1B, appropriate means are provided for holding and/or transporting the containers 10. While a continuous or semi-continuous process for treating the bottles or containers 10 is discussed below, it should be evident that the present invention is also applicable to batch processing.

While not shown in FIGS. 1, 1A or 1B, an automatic source for supplying the material to receptacle 3 and/or 16 can be provided. These materials can be supplied as a rod or other solid structure or in any other form. It is contemplated that material in the receptacle 3 will be in solid form and in particular will be in a chunky or nonpowder form. By minimizing the surface area of this material, detrimental affects of oxidization can be avoided. The material in the receptacle 3 (and 16, if present) will be a source of vapor in the coating chamber when acted upon by the electron gun 2. This vapor will be deposited on the bottles or containers 10 as will be described below. It should be noted that wiring 17 is indicated in FIG. 1A attached to the receptacle 16. This wiring 17 can be used to supply current to the receptacle 3 and/or 16 as described in U.S. Pat. No. 5,565,248, if so desired. Of course, such wiring can be omitted.

When the shield or plate 12 is used as a source, the degree of erosion can be approximately controlled by adjusting distance D between receptacle 3 and electron gun 2, and by the degree of cooling applied to plate or shield 12 by the means for cooling 15. This means for cooling 15 can cool one or both of the electron gun and the plate or shield 12. Water cooling or any other suitable cooling can be provided by this means for cooling 15. The other main variable affecting erosion of plate 12 is the voltage V applied to the electron gun 2, but this is normally adjusted independently according to the plasma generation and evaporation rate requirements.

The choice of coating solids 4 and gaseous substance 7 depends on the process criteria (cost, coating color, degree of gas barrier necessary size of bottle and particularly the type of plastic used in the bottle). Good gas barriers have been obtained by procedures described above by means of on-surface reaction of silicon with oxygen, giving $SiO_x$ where x is greater than 1.8, and normally insignificantly less than 2 and thus, glass-like transparent. Also, the blending-in of significant proportions (i.e. about 1–50%) of Ti and/or Al and/or B and/or mono-valent metals (such as Na K) and/or divalent metals (such as Mg, Ca) have increased gas barrier in certain conditions, whereby in case of Ca, Mg, Na or K these can be introduced in the form of a salt (e.g. $CaF_2$ or $MgF_2$), and in case of B the introduction can be in the form of the solid oxide. Alternatively, the process conditions described can provide good gas barriers, using metals (such as Ag, Al, Cr, Ge, Ti, Sn, An, Zr), or mixtures of metals, instead of silicon, and reacting these with gaseous substances T other than oxygen, such as N, S or halogens. To such metallic coatings, silicon may be beneficially added. It is contemplated that the coating contains 0.01 to 50% of one or more elements selected from the group consisting of Li, Na, K, Rb, Cr, Mg, Ca, Sr, Ba, Ti, Al, Mn, V, Cr, Fe, Co, Ni, Zn, Cu, Sn, Ge and In.

Use of metals and other gaseous substances also enables colored coatings, or UV-absorbent coatings (by choosing the reactants appropriately). More than one layer, each layer comprising a different composition, can also be beneficial, particularly when producing colored coatings, since combining colored and transparent layers enables a good gas barrier to be obtained with minimum thickness of colored coating, thus enhancing recyclability. When more than one type of substance is used as coating solid 4 it is often necessary to provide more than one source 1, since differences in vapor pressure between substances can result in fractionation and uncontrolled proportions of each substance in the coating 9.

Surface pretreatment, aimed at activating bottle surface 6 by forming free radicals on the surface, assists in providing continuous coatings and good adhesion, leading to durable gas barriers. Such pretreatment is possible using a gaseous pretreatment substance 13 (which can often be the same as the gaseous substance 7 or substances) and at same cell pressure conditions. The pretreatment time is adjusted so as to lightly activate the surface only, since heavy activation is accompanied by degradation of the bottle surface 6, in turn leading to poor adhesion rather than the improved adhesion, which is the aim of the pretreatment process.

Pretreatment is carried out either by using the in-bottle antenna 11 with RF or HF energy to create a gas-plasma on bottle surface 6, or by connecting a coating cell antenna 14 to a DC or HF or RF source and creating a plasma within the entire cell.

It is desirable that the bottle surface 6 is degassed to remove absorbed moisture and low molecular weight materials. This is achieved by holding the bottle 10 in a vacuum for a period of 5–180 s. The time required for degassing is dependent on the condition of bottle 10 (in relation to its temperature and absorbed vapors). Bottles 10 blown immediately after blow molding can be degassed relatively quickly, and location of coating process beside a blow molder is desirable. Also, degassing can be accelerated using energy, by applying either RF or HF to the internal antenna 11, or DC/RF/HF to the coating cell antenna 14, or from an IR source located near bottle surface 6, not shown.

For certain compositions of coating 9, it is desirable to apply the coating on a bottle 10, which during the coating process has an internal pressure significantly higher than the cell pressure. This gives improved gas barrier by enabling coating 9 to relax/contract when bottle 10 is not under pressure while also enabling coating 9 to resist cracking due to stretching when bottle 10 comes under pressure in normal use.

Some plastic surfaces, particularly those of PET, which is a polymer most commonly used in plastic bottles, deteriorate after blow molding due to the migration to the surface of low molecular weight components. It is important to determine the quality of the bottle surface 6 prior to coating. Under scanning electron microscope, these migrating components can be observed on bottle surface 6, and an important quality control can thus be applied.

Figure 7A:
FIG. 7A shows a scanning electron microscope (SEM) photograph of a PET bottle surface after in-plastic light molecular weight components have diffused to the surface.
Figure 7B:
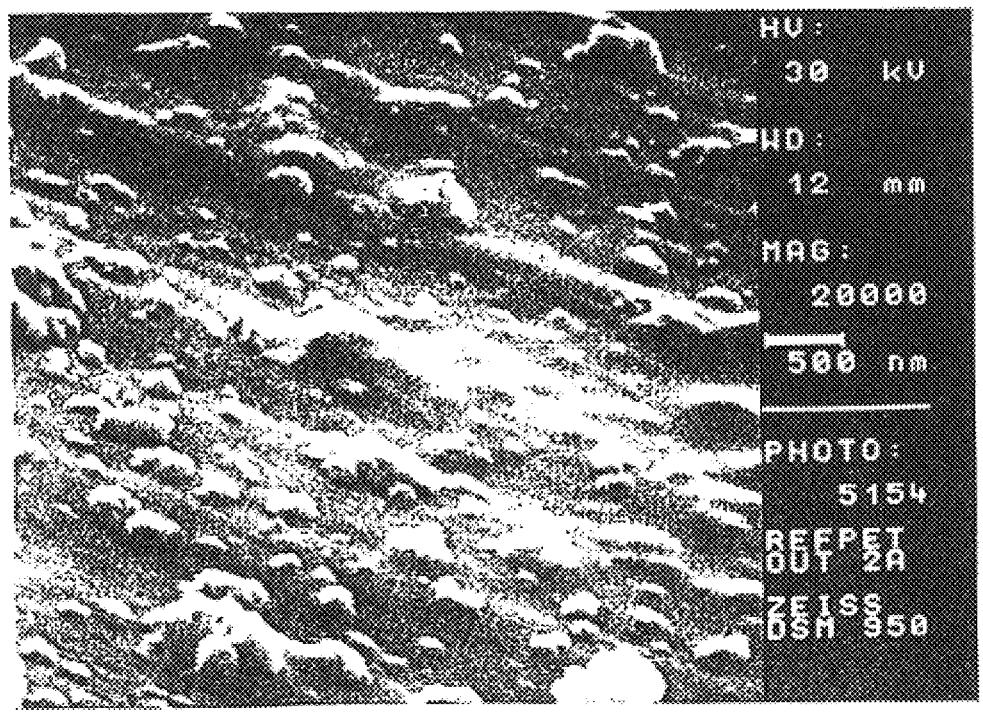
FIG. 7B is a photograph similar to FIG. 7A showing a refillable PET bottle surface.
Figure 7C:
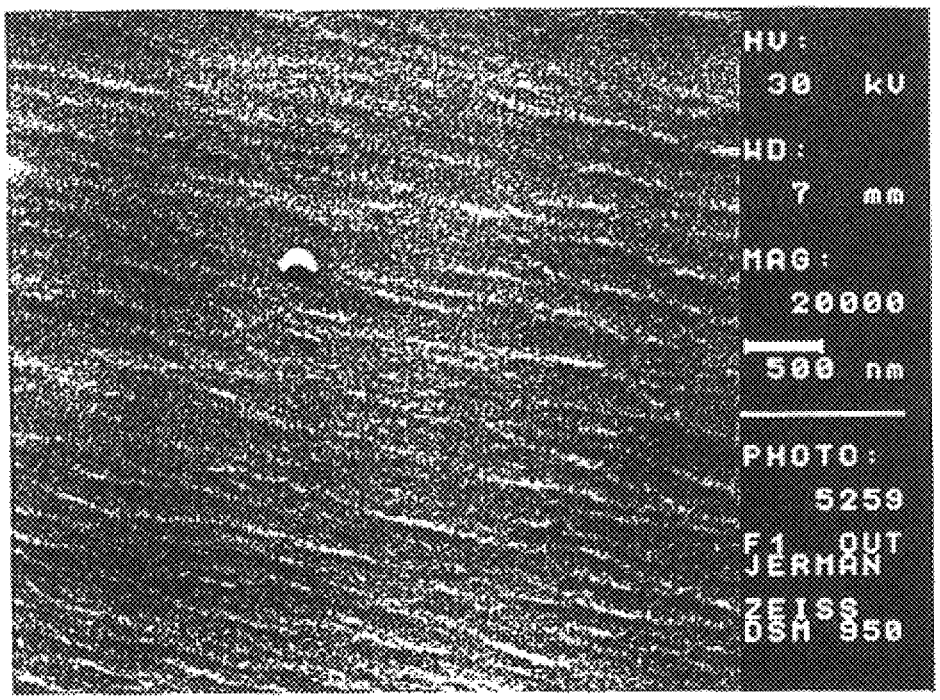
FIG. 7C is a similar photograph to FIG. 7A before this diffusion has taken place.
Figure 7D:
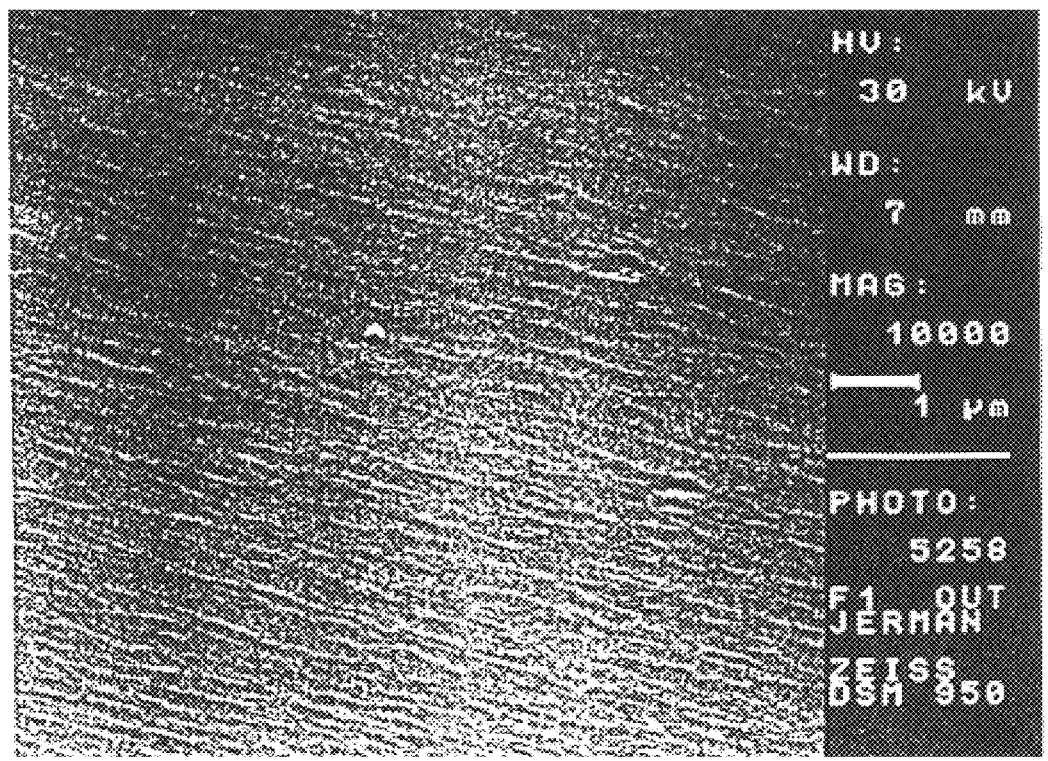
FIG. 7D is a similar photograph to FIG. 7C before this diffusion has taken place, but at a ½ magnification of only 10,000 times.

FIGS. 7A and 7B show a typical PET bottle surface after surface diffusion of low molecular weight components and FIGS. 7C and 7D show, by way of comparison, a PET bottle surface soon after the blow molder, when no diffusion has taken place. For quality control, it has also been demonstrated that Rutherford-Back-Scatter (RBS) is able to determine the thickness of very thin coatings (e.g. 50 nm) and also their composition, the latter being important when coating with more than one solid component. X-ray fluorescence also can be used to measure coating thickness, and, because this is a relatively simple process, X-ray fluorescence can be applied as an in-line quality control system after a coating machine. Finally, observing the surface of coated bottles 10 under a scanning electron microscope after these bottles 10 have been subjected to gas pressure, enables a first indicator of coating performance, since coatings 9, with poor gas barrier performance, have tendency to crack/peel.

Figure 8A:
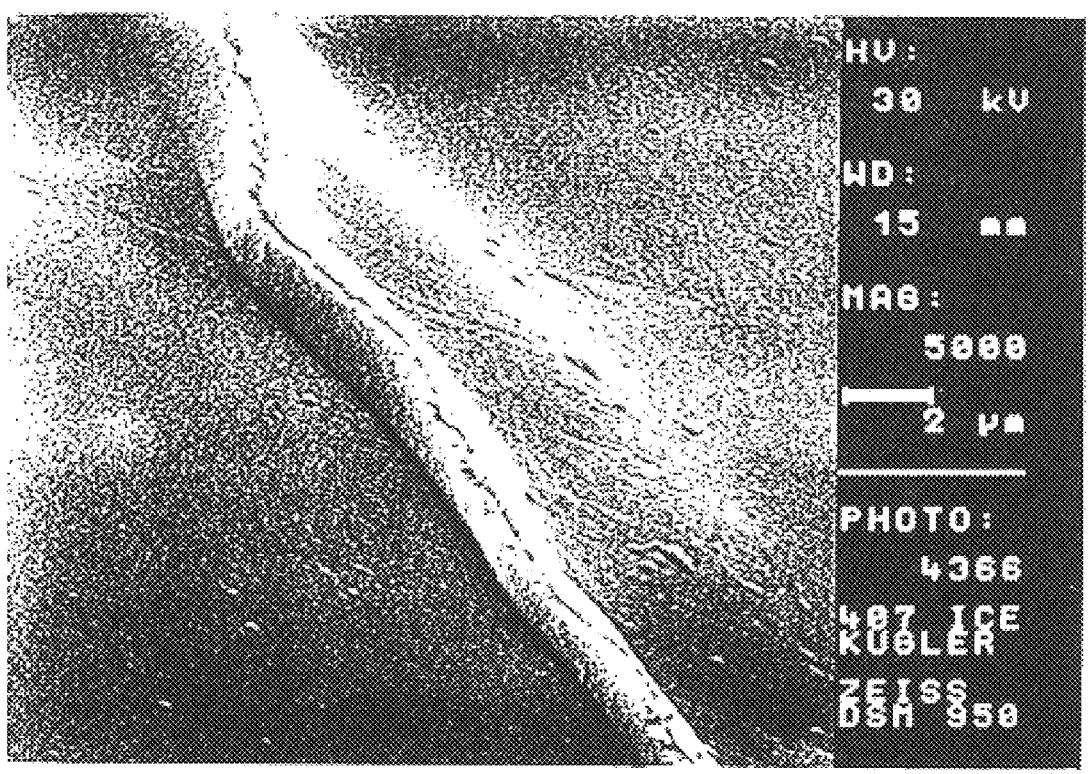
FIG. 8A shows an SEM photograph of the surface of a PET bottle, which has been stretched when the bottle was pressurized to a pressure of 6.5 bar, and whose coating has good adhesion and good coverage in spite of this stressing.
Figure 8B:
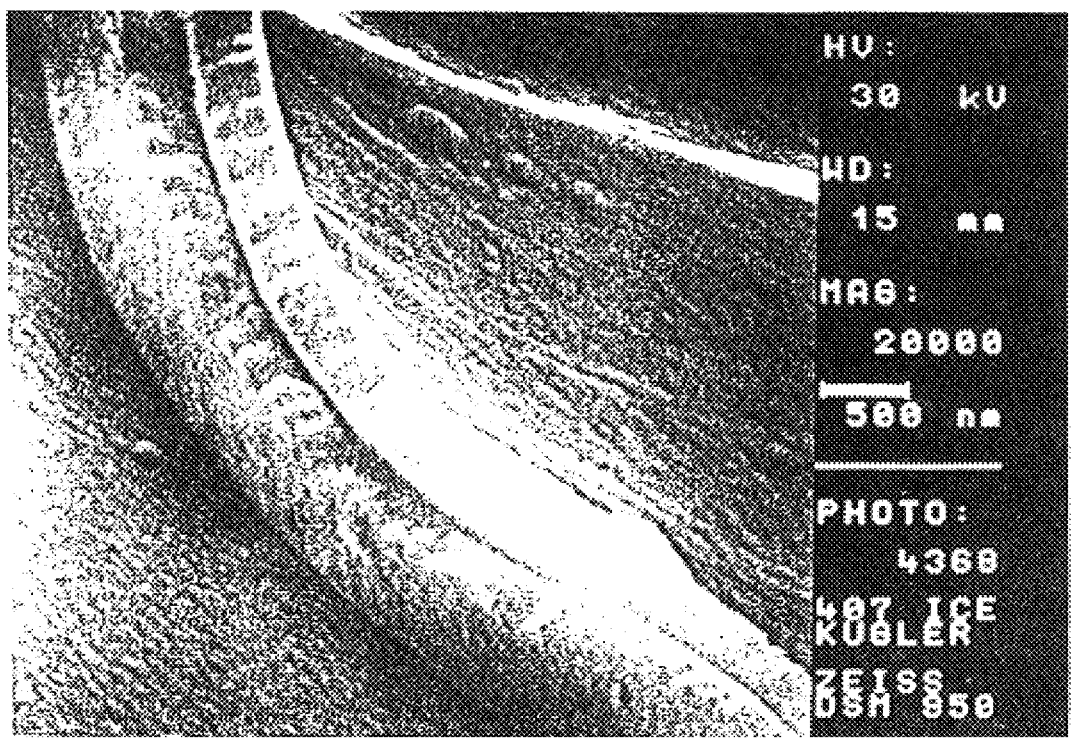
FIG. 8B is a similar photograph to FIG. 8A, but the view at 4 times magnification (20,000 times)
Figure 8C:
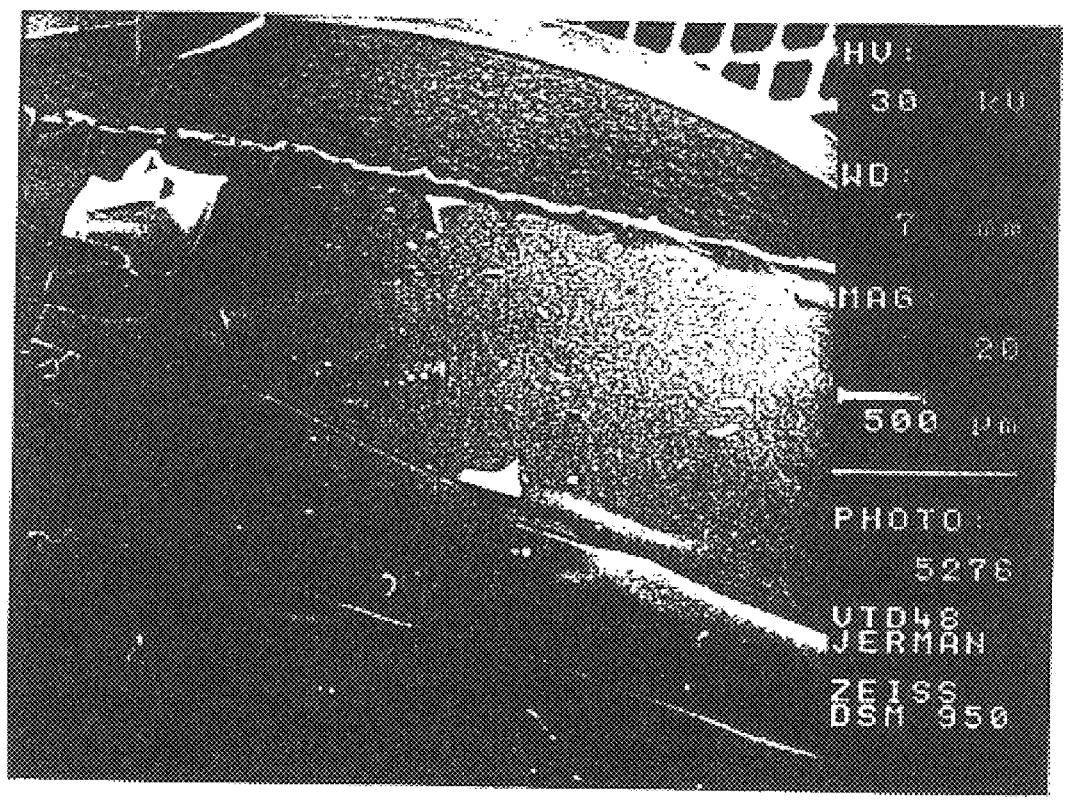
FIG. 8C is a similar photograph to FIG. 8A of a coating which has poor adhesion and stretchability.
Figure 8D:
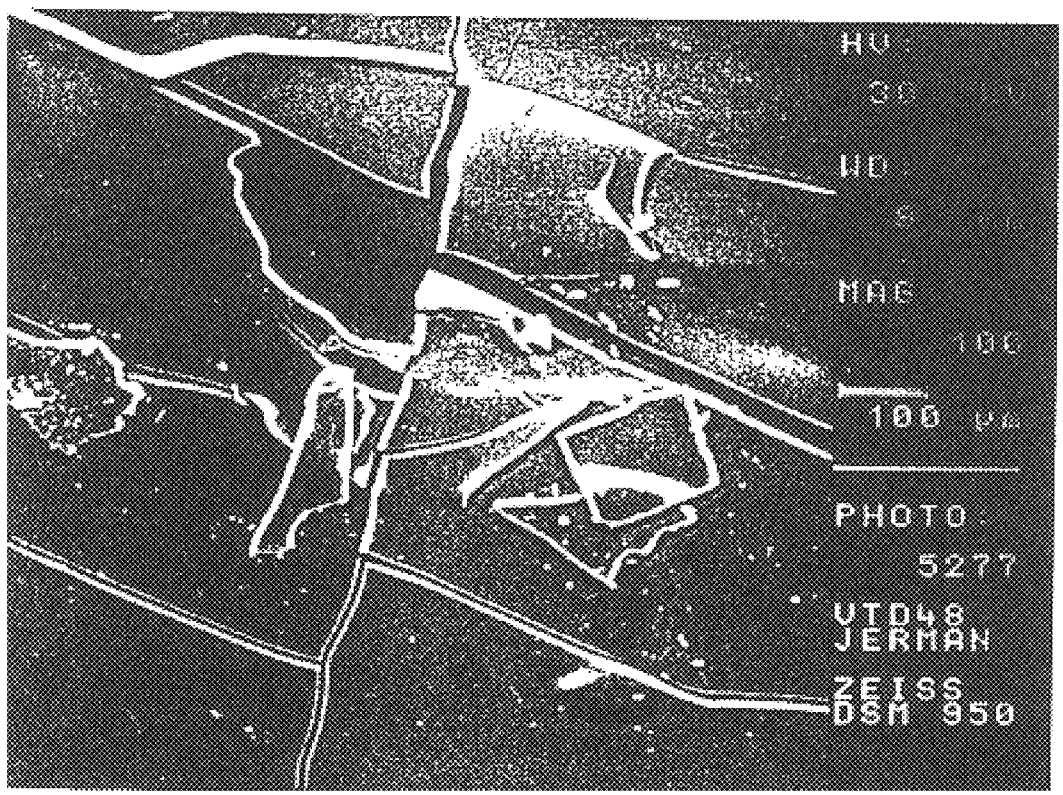
FIG. 8D is a similar photograph to FIG. 8C of a coating which has poor adhesion and stretchability, but at 100 times magnification.

FIGS. 8A and 8B show the surface of a coated PET bottle after the bottle was subjected to an in-bottle pressure of over 6 bar and part of the coating was deliberately scratched to enable its continuous coverage and its adherence, even close to the damage, to be observed. For comparison, FIGS. 8c and 8D show a coating with poor surface adhesion, where distinct peeling and splitting in the coating has been caused by the stretching of the PET.

FIG. 2 shows an antenna and bottle capping arrangement, as an example. Other similar arrangements achieving the same result are possible. A cap 20 incorporates a sealing ring 21, a threaded portion 22, a snap-in, quick-release connector 23 and a contact ring 24 for the biasing voltage which can be applied either by RF (radio frequency) or HF (high frequency). The contact ring 24 has an electrical connection 25 which has a sliding contact with the antenna stem 26. The antenna stem 26 is mounted in a bearing 27, which is in turn mounted inside the cap 20, and is free to rotate within the cap. The antenna 30 has the antenna stem 26, hinged arms 31a, 31b, light antenna segments 32a, 32b and a heavy antenna segment 33. Hinged arm 31b also acts as antenna for the base of bottle 10 when extended. At the base of the antenna stem 26 is a ball bearing 34, which can rotate freely, and is pressed downward by a spring 35 and a pin 36. When antenna 30 is outside the bottle 10, the antenna segments 32, 33 are folded against the antenna stem 26, due to the action of the spring 35, as shown in FIG. 2A. Pin 36 has a base stop 37 and a swivel 38 to which the hinged arm 31b and the antenna segment 32b are connected. As pin 36 moves up/down, hinged arm 31b and antenna segment 32b extend outward or fold against antenna stem 26. When the antenna 30 is inserted into the bottle 10, the ball bearing 34 is forced to compress the spring 35 and this extends the hinged arm 31b outwardly from the antenna stem 36, which erects the antenna 30 so that all its segments 32a, 32b and 33 approach the walls of bottle 10. A gap between walls of bottle 10 and antenna 30 is maintained which is as close to the walls of bottle 10 as possible, but without touching, and is in practice between 3 and about 15 mm.

Cap 20 is screwed onto the threaded finish (mouth) of bottle 10 and the gaseous content of bottle 10 is thereby sealed by sealing ring 21. A tool (not shown), enters the connector 23 in cap 20 and provides the screw driver action for turning the cap 20 to screw it onto bottle 10. The same tool holds the bottle 10 (until released by connector 23) and makes contact with the RF/HF biasing voltage on contact ring 24. Of course, a snap-in, quick-release connector or other known connections for cap 20 instead of a screw connection could also be used. When the bottle 10 is held and turned horizontally, the heavy antenna segment 33 ensures that the antenna 30, which has no contact with the walls of bottle 10, is able to maintain a position facing vertically downwards and therefore acts as means for orienting the antenna to generally face the at least one source during coating. When antenna 30 is orientated while bottle 10 is rotated in vertical position, use of a magnetic material in antenna segment 33 and an external magnet, appropriately positioned, enable the antenna 30 to face in the correct direction. Accordingly, this magnet will act as magnetic orientating means for orienting the antenna when the longitudinal axis of the container is generally vertically oriented.

The principle demonstrated by FIGS. 2A and 2B can also be applied to a multi-segment design. In such a multi-segment design, where a plurality of antenna-segments 32*a,* 32*b,* 33 and hinged arms 31*a,* 31*b* enable a folding arrangement which can pass through the finish of bottle 10 and can be erected within bottle 10 giving a 360° C. antenna-coverage of its walls. In such a case, the need for antenna orientation is eliminated and a greater portion of the bottle is subject to biasing energy, enabling shorter coating times in certain applications.

Moreover, apart from using the antenna 11 or 30 a back plate 18 in the vacuum cell can be provided as indicated in FIG. 1. The bottles or containers 10 are positionable between this back plate 18 and the source 1. When used, this back plate can result in the insertion of an antenna 11 or 30 into bottles 10 unnecessary. This can speed the overall process, reduce the need to have an inventory of antennas and can provide other benefits.

Alternatively, a portion or all of the vacuum cell 50 or coating chamber 8 can be used as an antenna. For example, the back plate 18 can be omitted and the ceiling alone or the ceiling and some of the walls or the entire chamber 8 can be used as the antenna. Other arrangements are also possible.

Another potential for avoiding the antennas 11 or 30 comprises providing a magnetic source within the vacuum cell 50 as generally indicated by numeral 58 in FIG. 3. The number of magnetic sources 58 and there location within vacuum cell 50 can readily be varied. This magnetic source 58 acts as a means for generating a magnetic field within the vacuum cell 50 wherein the field directs the coating vapor.

This magnetic source could alternatively be used to selectively direct the coating vapor going to the bottle surface, thereby avoiding some or all of the need to mechanically rotate or translate the bottles. This magnetic source will therefore act as means for generating a field to direct the coating vapor.

While still using an in-bottle antenna, FIGS. 2C and 2D show another possible type of antenna 69. This antenna 69 is straight and therefore is more easily inserted into and removed from the bottle or container 10. This antenna 69 simply runs as a straight "peg" from the cap to within a few millimeters of the base of the bottle or container 10. This antenna 69 also simplifies the operation because no pivoting, orientation, folding-out to fit the walls of the bottle or container 10, etc. are needed. While antenna 69 is shown as being generally coextensive with the longitudinal axis of the respective bottle or container 10, it is contemplated that a skewed orientation is also possible. In other words, antenna 69 would be angled relative to the longitudinal axis of the bottle or container 10. In such an angled position, the antenna 69 may or may not intersect the longitudinal axis of the bottle or container 10.

Alternatively, a corkscrew antenna could also be used. This antenna would be screwed into the bottle or container 10, yet would be closer to the sidewalls than the straight antenna 69 without touching these sidewalls. Other possible antennas are, of course, also possible.

It is normally desirable to avoid coating the threaded finish of a beverage bottle, because this may affect the closure performance characteristics and because this can come in contact with the beverage and perhaps the mouth of the consumer. Although all of the coatings used in this invention are safe in contact with food, it is nonetheless desirable to restrict beverage contact to the main bottle material. Cap 20 covers the finish portion of bottle 10 and prevents the coating 9 from spreading to it.

FIG. 3 shows one embodiment of a coating machine in accordance with this invention, which enables continuous, economic coating of the bottles. In view of the fact that bottles are inexpensive, mass produced, single use packages, it is important to arrive at an embodiment which provides a very low cost operation, is compact (because preferred location is beside a bottle blow molder), and is suitable for mass production (i.e. preferably continuous rather than batch processing).

In FIG. 3, the sequence of operation of the present invention is illustrated. Bottles or containers 10 will move through the various stages A through H. Initially, the bottles are supplied via conveyor 39 to a loading/unloading station 40. The bottles or containers 10 can be fed immediately from a forming machine 29 to the coating system. This forming machine includes a blow molding machine, injection molding machine, extrusion molding machine or any other known machine for forming containers or bottles 10. As will be described below with reference to FIGS. 7A–7C, the surface of a PET bottle, for example deteriorates over time. If the containers or bottles 10 are quickly coated after being formed, then potential obstructions to improved adhesion on the surface of the bottles or containers 10 are absent.

From conveyor 39, an operator can manually move or other suitable equipment can automatically move the bottles or containers 10 to the loading/unloading station 40. The conveyor 39 can feed bottles from a molding machine or any other upstream process.

At the loading/unloading station 40, the bottles or containers 10 are placed into or removed from a holder 41. This holder can have open interior or it can have segmented sections for receiving individual bottles 10. The arrangement of the holder 41 will be discussed in more detail below. The holder 41 used in FIG. 3 has four bottles in two rows for a total of eight bottles. Of course, this configuration could be modified so as to meet the needs of the system.

The holder 41 with the loaded bottles or containers 10 can be manually or automatically moved from the loading/unloading station 40 at stage A to the tool station 42 at stage B as noted above. The operation of this tool station 42 will be explained in more detail below with reference to FIG. 4. At this tool station 42, an antenna 30, cap 20 and an air-displacement collar 60 can be inserted into or removed from the bottles or containers 10. The cap 20, antenna 30 and collar 60 will be collectively designated as "tools". The tools as well as the holder 41 should be made of a non-gassing (low-absorbent) material whose surface cannot damage the surface of the coated or uncoated bottles or containers 10.

From the tool station 42 at stage B, the holder 41 with the bottles or containers 10 can be manually or automatically moved into the evacuation cell 43 at stage C. Some door, air lock or other feature 56 is provided for enabling a vacuum to be formed within the evacuation cell 43. As will be explained in more detail below, the displacement collar 60 which had previously been applied to the bottles or containers 10 can be removed or reapplied in the evacuation cell 43. Also, a vacuum is either created or released in this evacuation cell 43 as will be described below.

From the evacuation cell 43, the holder 41 and bottles or containers 10 move into the loading/unloading table 44 at stage D. Loading of the bottles from holder 41 to bottle-carrying bars 51 is carried out on this table 44. Also, the bottles or containers 10 are unloaded from the bottles carrying bars 51 back into the holder 41 as will be described in more detail below.

When the bottles or containers 10 are mounted on the bottle-carrying bars 51 at stage D, they are then passed to the degassing and pretreatment sections 45 and stage E. The antenna 30 which can be within the interior of the bottles or containers 10 will be oriented by a magnet 46 in the degassing and pretreatment sections 45. The bottles or containers 10 have their longitudinal axes generally vertically aligned when in the degassing and pretreatment sections 45 of stage E.

From the degassing and pretreatment sections 45, the bottles or containers 10 on the bottles carrying bars 51 will move to the base coating section 47 at stage F. Then the bottles or containers 10 will move the sidewall coating section 48 at stage G. It should be noted that the bottles or containers 10 move from a generally vertically orientation in stage F to a generally horizontally orientation in stage G. This arrangement will be described in more detail below. From stage G, the bottles return to the loading/unloading table 44. The bottles or containers 10 are removed from the bottle-carrying bars 51 and reinserted into the holders 41. The holders 41 are then moved through the evacuation cell 43 at stage C to an intermediate holding position 49 at stage H.

Figure 3:
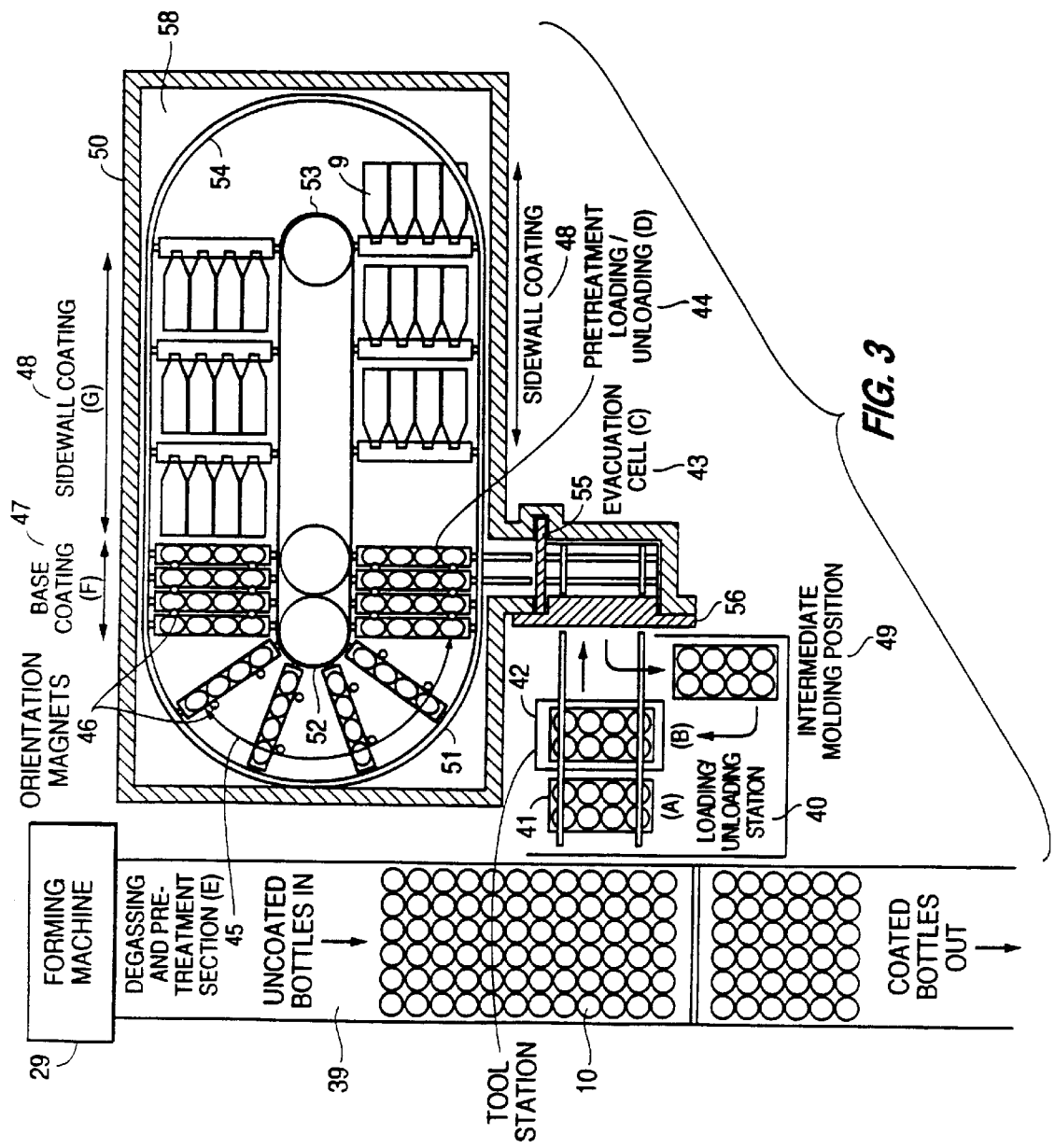
FIG. 3 is one embodiment of a coating machine in accordance with the present invention.

Now after this general description, a more detailed description of the arrangement of FIG. 3 will now be given. First, the bottles or containers 10 are loaded into holder 41 at stage A as noted above. An operator can manually insert the tools, cap 20, antenna 30 and collar 60, onto the bottles or containers 10 or this step can be automatically carried out with appropriate equipment. This operation is carried out at the tool station 42 at stage B.

When the holders 41 and bottles or containers 10 are moved into the evacuation cell 43 at stage C, a vacuum will be created in this cell 43. The collar 60 previously applied at tool station 42 during stage B will be used to evacuate the interior of the bottles or containers 10 prior to the evacuation of pressure from cell 43. The purpose of collar 60 is reduce the amount of air brought into the evacuation cell 43. Together with the holder 41 into which bottles or containers 10 tightly fit, the pre-evacuation of the containers or bottles 20 reduces the amount of air which must be evacuated from the cell 43. In other words, the bottles or containers 10 tightly fit into the holder 41. This holder 41 tightly fits within the walls of the evacuation cell 43 in order to minimize the amount of air exterior of the containers or bottles 10.

Before or during insertion of the holder 41 with the bottles or containers 10 into the evacuation cell 43, the collar 60 is utilized to remove air from the interior of the bottles or containers 10. Therefore, the vacuum system for evacuating cell 43 need only evacuate the little amount of air existing in the cells exteriorly of the containers or bottles 10. Therefore, the vacuum system capacity can be reduced. This is an important economic consideration in view of the low operating pressure of the vacuum cell 50. This also helps to prolong the life of the vacuum system and helps to minimize the amount of energy consumed with the instant system.

From the evacuation cell 43 at stage C, the holder 41 with the bottles or containers 10 is moved to the loading/unloading table 44 at stage D. This loading/unloading table 44 is within the vacuum cell 50. The vacuum cell 50 and the evacuated cell 43 are both connected to a conventional vacuum system (not shown). When the evacuation cell 43 reaches the appropriate pressure, various steps are undertaken including opening of door 55 to permit entry of the holder 41 with the bottles or containers 10.

Within the vacuum cell 50, the bottles or containers 10 are degassed and pretreated in section 45 at stage E. This degassing at stage E can take sixty seconds, for example. It should be noted that degassing of the containers or bottles 10 actually starts in the evacuation cell 43 at stage C. The degassing is completed during the pretreatment in section 45 of stage E. The bottles or containers 10 are moved out of the holder 41 at the loading/unloading table 44 and onto bottle-carrying bars 51 which will be described in more detail below. The bottles are moved from the loading/unloading table 44 area in stage D to the subsequent stages within the vacuum cell 10 by movement of the bottle-carrying bars 51.

While a conveyor arrangement will described below for moving these bottle-carrying bars 51, it should be appreciated that many different arrangements could be used in order to convey the bottles or containers 10 through the vacuum cell 50.

In the degassing and pretreatment sections 45, orienting magnets 46 can be used to orient the antennas 11 or 30 as desired. The antennas could be stationary relative to a certain point on the container or bottles 10 or can be movable relative to the bottles or containers 10. In the degassing and pretreatment section 45 at stage E as well as in the downstream base coating section 47 of the stage F, the bottles or containers 10 have their longitudinal axes vertically oriented.

In the pretreatment loading/unloading table 44 area at stage D or in the degassing and pretreatment section 45 of stage E, heating of the bottles or containers 10 can be carried out if appropriate. At these stages D or E or throughout the vacuum cell 50, radiant or infrared heaters (not shown) could be provided such that the bottles or containers 10 would be at an appropriate temperature. For example, this temperature could be ambient to 60° C.

Apart from the bottles or containers 10 being at an appropriate temperature to facilitate degassing, the antennas 11 or 30 with the containers can be used to accelerate the degassing as has previously been noted. In particular, either RF or HR energy is applied to the internal antenna 11 or 30. Alternatively, as noted with regard to FIG. 1, a coating cell antenna 14 can be provided. DC/RF/HF energy can be applied to this coating cell antenna 14 or from an infrared source located near the bottle surface 6. All of these features can accelerate degassing. Also, the provision of a vacuum aids in the degassing process. It should be noted again that the antennas 11 or 30 inserted into the bottles or containers 10 are also used in the pretreatment steps.

In particular, pretreatment is carried out either by using the in-bottle antenna 11 or 30 with RF or HF energy to create a gas-plasma on the bottle or container surface 6, or by connecting a coating cell antenna 14 as shown in FIG. 1 to a DC or HF or RF source in creating a plasma within the entire cell 50. Alternatively, this cell 50 could be segmented into sections such that the plasma is only created in the degassing and pretreatment section 45 of stage E. The pretreatment will lightly activate the surface of the bottle or container 10 in order to improve the downstream coating. This pretreatment forms free radicals on the surface 6 of the bottle or container 10 to assist in providing continuous coating and good adhesion leading to durable gas barriers. The pretreating step can last for 60 seconds, for example.

The bottle bars 51 holding the bottles or containers 10 can allow for rotation of the bottles through the degassing and pretreatment section 45 of stage E. For example, the bottles or containers 10 could be rotated at two revolutions per minute, for example. The RF bias used in pretreatment can be 700 volts with a 50 watt antenna. The gas within the degassing and pretreatment section 45 of stage E is contemplated as being $O_2$ but any desired gas can be used. The gas flow will be controlled so as to maintain correct pressure within the area of degassing and pretreatment section 45. This pressure can be $2 \times 10^{-4}$ mbar. The duration could be, however, anywhere from 20–120 sec. with the bottles being rotated at 1–10 revolutions per minute. Also, the pressure can be from $1-5 \times 10^{-4}$. The flexibility in these ranges are given only as an example to indicate the required scope. For example, the pretreatment duration can be achieved by varying the machine speed without an accompanying change in machine size, whereby the accepted results would be a change in output. Therefore great flexibility is obtainable with the system of the instant invention.

The coating process is carried out in two parts. First, there was the previously noted base coating section 47 at stage F. Then the sidewall coating section 48 at stage G completes coating of the bottles or containers 10. In this base coating section 47, the bottom or base of the bottles or containers 10 are coated. Then as will be described in more detail below, the longitudinal axes of the bottles are changed from the vertical to a horizontal orientation. This is achieved by increasing space between bottle bars 51. As will be described below with reference to a fast-moving chain 53 and a slow-moving chain 52, this reorientation of the bottles or container 10 can take place. Throughout their vertical and horizontal orientations, the bottles or containers 10 are close to each other to give best utilization to the evaporators or source 1, but they do not touch. The bottles in the horizontal orientation are then moved through a sidewall coating section 48 at stage G. As the bottles move through the section, they can be rotated about their longitudinal axis.

The bottles or containers 10 can be coated throughout movement in the sidewall coating section 48 or only in a portion thereof. The distance of the coating section 48 over which the bottles are coated can be influenced by the amount of coating desired to be deposited on the bottles. For example, various sources 1 can be provided in the vacuum cell 50 for supplying the coating vapor to the bottles or containers 10. If a thicker external coating is desired, then more of the sources 1 could be activated as opposed to when a thinner coating is desired. Of course, other criteria can be modified in order to influence the thickness of the coating on the exterior of the bottles or containers 10.

Similarly to the pressure in the degassing and pretreatment section 45 of stage E, the pressure in both the base coating section 47 and the sidewall coating section 48 of stages F and G can be $2 \times 10^{-4}$ mbar and can be in the range of 1 to $5 \times 10^{-4}$ mbar. It is contemplated that the base coating in stage F will take 15 seconds but can be in the range of 10–30 seconds. The sidewall coating in stage G can take 60 seconds but be in the range of 20–120 seconds. The bottles will rotate two revolutions per minute in both sections 47 and 48 but can rotate from 1–10 revolutions per minute. The bottle energy (RF-bias) will be 700 volts with a 50 watt antenna for at least the first 20% of the coating cycle. These numbers are merely given by way of example and can be varied.

Within the coating cell 50, an evaporator system can be provided. This evaporator system was described with reference to FIG. 1 and will also be described in more detail with reference to FIGS. 6A and 6B. In particular, evaporators or source 1 are provided in order to provide the coating which will be deposited on the exterior of the bottles or containers 10.

Figure 6B:
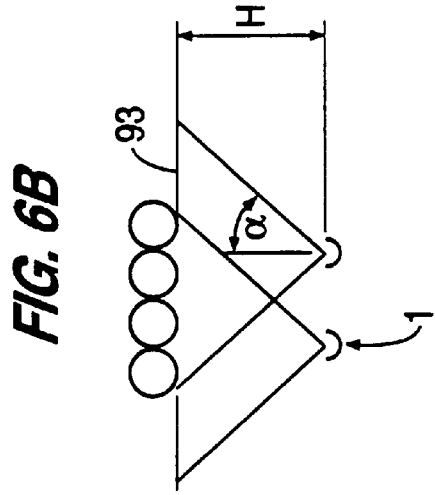
FIG. 6B is a side sectional view taken along line VI—VI of FIG. 6A.
Figure 6A:
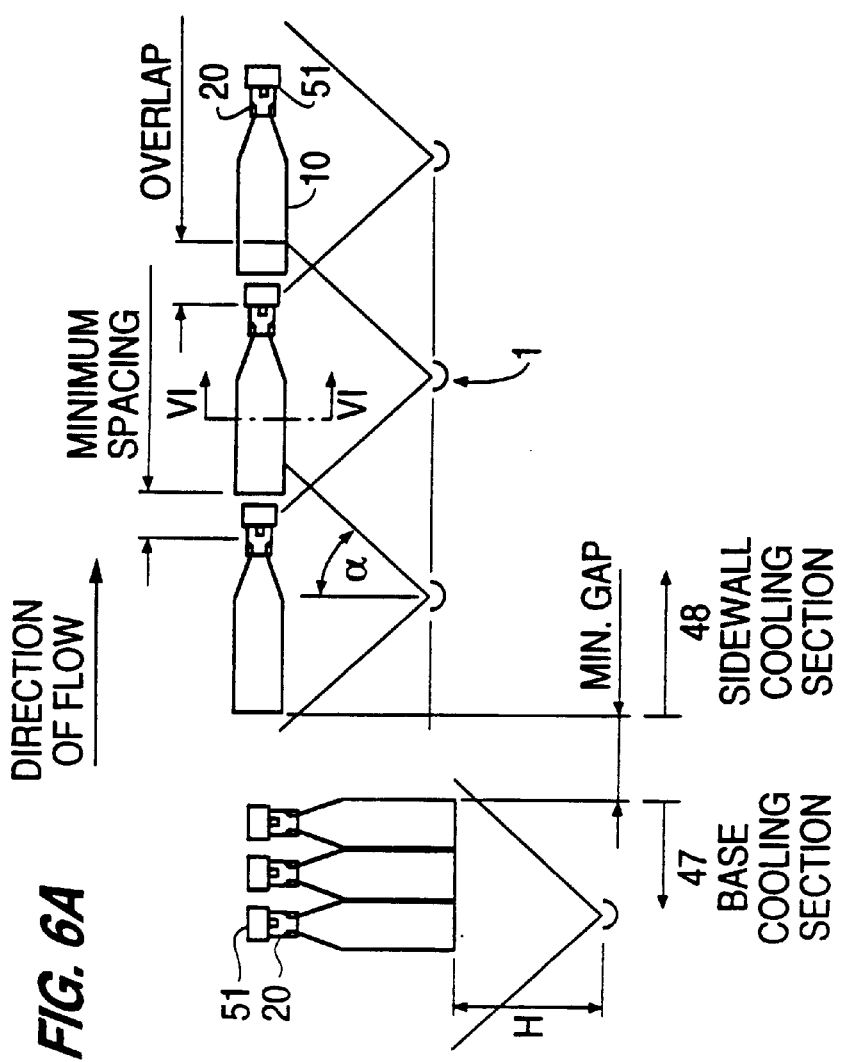
FIG. 6A is a view of bottles moving past plasma-making and coating sources.

The evaporators can be arranged in rows so that the evaporator fluxes overlap their paths, giving an even longitudinal deposition rate R. This rate can be 3 nm/s and be in the range of 1–10 nm/s. The angle of contact $\alpha$ which was previously discussed therefore only applies to row ends and to the row cross sections where there is no overlap. This angle of contact $\alpha$ is indicated in FIGS. 6A and 6B and can be 30° or at least in the range of 30–60°, for example. However, as previously noted this angle should not be greater than 70°. This will help to enhance coating adhesion.

It is desired that the evaporators layout must result in a minimum number of evaporators or sources 1 with the most effective use thereof. In other words, material loss should be minimized. The presentation of bottle rows to the evaporator or source 1 can be four in a row as indicated in FIG. 3 but this number can be varied as desired. It is merely desired that the evaporator or source 1 utilization will be optimized.

As will be described below for FIGS. 6A and 6B, dust screens or shields 93 can be provided. These shields or dust screens should be removable and easily cleaned. They will catch particles from the evaporator or source 1 which are not flowing to the bottle surface.

In order to avoid the need for switching off the evaporators or sources 1 during short cycle pauses, provision can be made for swing covers or similar covers to collect coating vapors during non-coating periods of the cycle. This will reduce the dust coating of the internal coating cell. Automatic function controls and automatic detection of malfunctioning evaporators or sources 1 can also be provided. It is estimated that the parameters specified will result in a coating thickness of about 50 nm. On this basis, the evaporation rate is estimated as follows. With the weight of the bottle being 30 grams and the PET thickness being 0.35 mm, the coating thickness can be 50 nm. Therefore, the proportion coating to PET (V/V) will equal 0.00014. The Si proportion of $SiO_2$ (W/W) will equal 0.467. The density of the $SiO_2$ will be 2.5 with the density of PET being 1.3. Therefore, the weight of Si of coating will be 0.004 g/bottle. At about 3,000 bottles per hour, the Si evaporated for bottle coating only (not including losses) will be about 11.5 g with about 30 g/h including the total losses.

As has been described with reference to FIG. 1, the distance between the evaporator or source 1 and the bottle surface (H) can be 0.5 and be in the range of 0.3 to 1 m. It should also be possible to remove sources 1 from the vacuum cell 15 for inspection and/or maintenance without releasing the coating or vacuum. A tandem evaporator system operating through vacuum locks is one possibility. In view of this, no automatic material feed to the evaporators would be needed. Of course, such an automatic material feed could be used, if so desired. The evaporating function must be monitored by instruments and can be visible from outside of the vacuum cell 50 by means of sight glasses, for example.

After moving through the sidewall coating section 48 at stage G, the bottles 10 will reenter the holder 41 at the loading/unloading table 44. This arrangement will be described in more detail with regard to FIG. 4. From the loading/unloading table 44 at stage D, the holders 41 with the reinserted bottles or containers 10 will back into the evacuation cell 43 at stage C. Prior to moving into this evacuation cell 43, the collars 60 will be placed on the containers at stage D.

When the holder 41 and bottles or containers 10 are reintroduced into the evacuation cell 43, the vacuum can be released. Then, the holder 41 containing the coated bottles or containers 10 will exit the evacuation cell 43. The holder 41 with the bottles 10 can then be slid to the intermediate holding position 49. At this position, the entry to the evacuation cell 43 will be clear such that another loaded holder 41 with uncoated bottles or containers 10 can be quickly reinserted into the evacuation cell 43. This helps to keep the continuous operation of the coating system. After evacuation cell 43 is reloaded, the holder 41 can return to stage B whereat the tools are automatically or manually removed. In other words, the cap 20, antenna 30 and collar 60 will be removed from the bottles or containers 10. Then, at the loading/unloading station 40 at stage A, the coated bottles or containers 10 can be removed from the holder 41 and returned to the conveyor 39 for subsequent processing. New uncoated bottles or containers 10 can be placed into the emptied holder 41 enabling the described cycle of operation to repeat.

When bottles 10 and holder 41 are viewed separately, bottles 10 first pass through stages A to G, and then return through stages C to H to A. There are two holders 41, and these first pass through stages A to G, and return by passing through stages C to H to A. There are sufficient sets of tools to cover all bottles in stages B through H. The tools are applied at stage B and return to stage B having passed through all the stages B to H.

Stages D, E, F, G are housed in a vacuum cell 50. Bottles 10 are gripped by bottle bars 51 and processed through the vacuum cell 50 by conveyor chains, one slow moving chain 52 and one fast moving chain 53. The slow moving chain 52 pushes the bottle bars 51 in a closely packed arrangement, during the cycle of operations when the bottles 10 are held in vertical position (for degassing and pretreatment at stage E and base coating at stage F) and the fast moving chain 53 pushes the bottle bars 51 with greater bar-to-bar spacing while the bottles 20 are in a horizontal position (for sidewall coating at stage G). The bottle bars 51 run in carrier rails 54 which firmly locate and carry the bottle bars 51 as will be described in more detail with reference to FIG 5A.

The evacuation cell 43 is equipped with conventional mechanized doors 55 which open/close to enable holder 41 to enter/exit. A ceiling door 55a in FIG. 5 allows the collar 60 to be removed and/or reapplied) by conventional means prior to the holder 41 moving into the main section of vacuum cell 50. The compartment above the evacuation cell 53, where the collar 60 is held after removal, is part of vacuum cell 50, and both this compartment and the main part of vacuum cell 50 are permanently under vacuum. Evacuation cell 43 is evacuated to enable holder 41 to enter vacuum cell 50 and is returned to normal pressure to allow holders 41 to exit the coating system.

Bottles 10 are conveyed conventionally along conveyor 39 to the coating machine (preferably directly from the blow molder), and to the bottle palletizing system after coating.

FIG. 4 shows the handling of bottles 10 and tools. Bottles 10 enter a holder 41 at stage A. Bottles 10 fit tightly into cavities within the holder 41 to reduce the air gaps as much as possible, as this in turn reduces vacuum pump duty. At stage B, a collar 60 is applied to reduce the air gaps around the necks of bottles 10 and the antenna 30 and cap 20 are fitted onto bottle 10. The caps 20 are screwed onto the bottles 10 by a series of screw drivers which are part of a tool applicator 61. At stage C, the holder 41 enters the evacuation cell through door 55. Overhead door 55a opens to allow collar 60 to be lifted off and stored in a storage compartment 62, within the vacuum cell 50. At stage D, the holder 41 is elevated to the bottle bars 51 which pick up the bottles 10 by means of the snap-in connector 23 on the caps 20. The bottle bars 51 now progress through the coating stages D to G.

After coating, the holder 41 is elevated at stage D to the bottle bars 51 and the bottles 10 are released into holder 41. The holder 51 returns to the evacuation cell 43, where the collar 60 is reapplied, and vacuum is released. Holder 41 exits to stage B, where the tool-applicator 61 descends, grips caps 20 by the snap-in connector 23, unscrews caps 20 and lifts caps 20, antennas 30 and collar 60 as a single unit, the collar 60 being lifted off by the caps 20, which lock in its underside. The tool-applicator 61 and the quick release, screw driver devices, comprise conventional technology and will not be described further.

FIG. 5A shows details of the bottle bars, bottle turning and bottle conveying. Bottle bars 51 hold a plurality of bottles 10 in a row. In FIG. 5A, four bottles 10 are shown, as an example only. A bottle drive shaft 70 on which worm gears 71 are fitted, runs inside the bottle bars 51, and is suspended by bearings 72 at each end of bottle bar 51. The cap 20 acts as means for gripping the neck of the bottle or container 10 to help hold it on bottle bar 51. As seen in FIG. 5B, this cap 20 also covers the neck and/or threads of the container or bottle 10 whereby coating of this area of the container can be prevented. The bottle drive shaft 70, also shown in FIG. 5B, is driven by bevel gears 73, and rotates by rotating the snap-in connectors 23 which are fitted with a screw driver end piece (not shown) to thereby act as means for rotating the containers or bottles 10 during transport through the vacuum cell 50. The bottle bar 51 is fitted at each end with carrier bars 74 in which it is free to swivel, due to bush bearings 75. The carrier bars 74 are fitted with carrier wheels 76 which run in a pair of carrier rails 54. The bottle bars 51 are conveyed by means of a drive chain 77, to which a pall-finger 78 is attached which in turn impinges upon an extension arm 79 on carrier bars 74. The drive chain 77 is attached to a main shaft 80 which is driven by conveyor motor 81. A bottle rotation motor 82 drives a bottle rotation sprocket 83 which is free to slide up/down main shaft 80 by means of bearing bushes 84. Bottle rotation sprocket 83 drives bottle rotation chain 85 which in turn drives the bevel gears 73.

The bottle bars 51 are attached to a guide wheel 90 which runs in a guide rail 91. This guide rail 91 is able to turn the bottle bar 51 from a position holding bottles 10 vertically (as shown) to a position holding bottles horizontally by means of guiding the guide wheel up a ramp 92 at the appropriate part of the conveying cycle. This switch from a vertical orientation to a horizontal orientation occurs between stages F and G. When the bottles or containers 10 are horizontally oriented, the bottles or containers 10 continue to rotate without interruption by means of bevel gears 73 while the bottle rotation sprocket 83 moves up the main shaft 80 to accommodate the new position of the bevel gears 73. Dust screens 93 previously noted protect the main parts of the drive system.

FIG. 6A is a view of bottle motion past source 1, both for base coating and sidewall coating. Bottles 10 and caps 20 are held vertically in the base coating section 47 by bottle bars 51 which continuously rotate both the bottles 10 and caps 20. After base coating the bottles 10 are turned to horizontal position for sidewall coatings as quickly as possible (i.e. with minimum gap between base coating section 47 and sidewall coating section 48). The bottles are continuously rotating throughout the conveying cycle. Bottle bars 51 are designed compactly to minimize spacing between bottle rows in horizontal position. Sources 1 are positioned so as to minimize the number of sources 1 needed and according to the criteria discussed in conjunction with FIG. 1, but with some overlap as shown in FIG. 6B to ensure full coating coverage. Dust screens 93, which are easily removable for cleaning, protect the machine parts from those deposits from source 1 which do not impinge on bottle 10. Strip brushes with dust screens are used to separate, whenever possible, the main coating cell of vacuum cell 50 from the chains, motors, etc. used for transporting the bottle bars 51.

Figure 9:
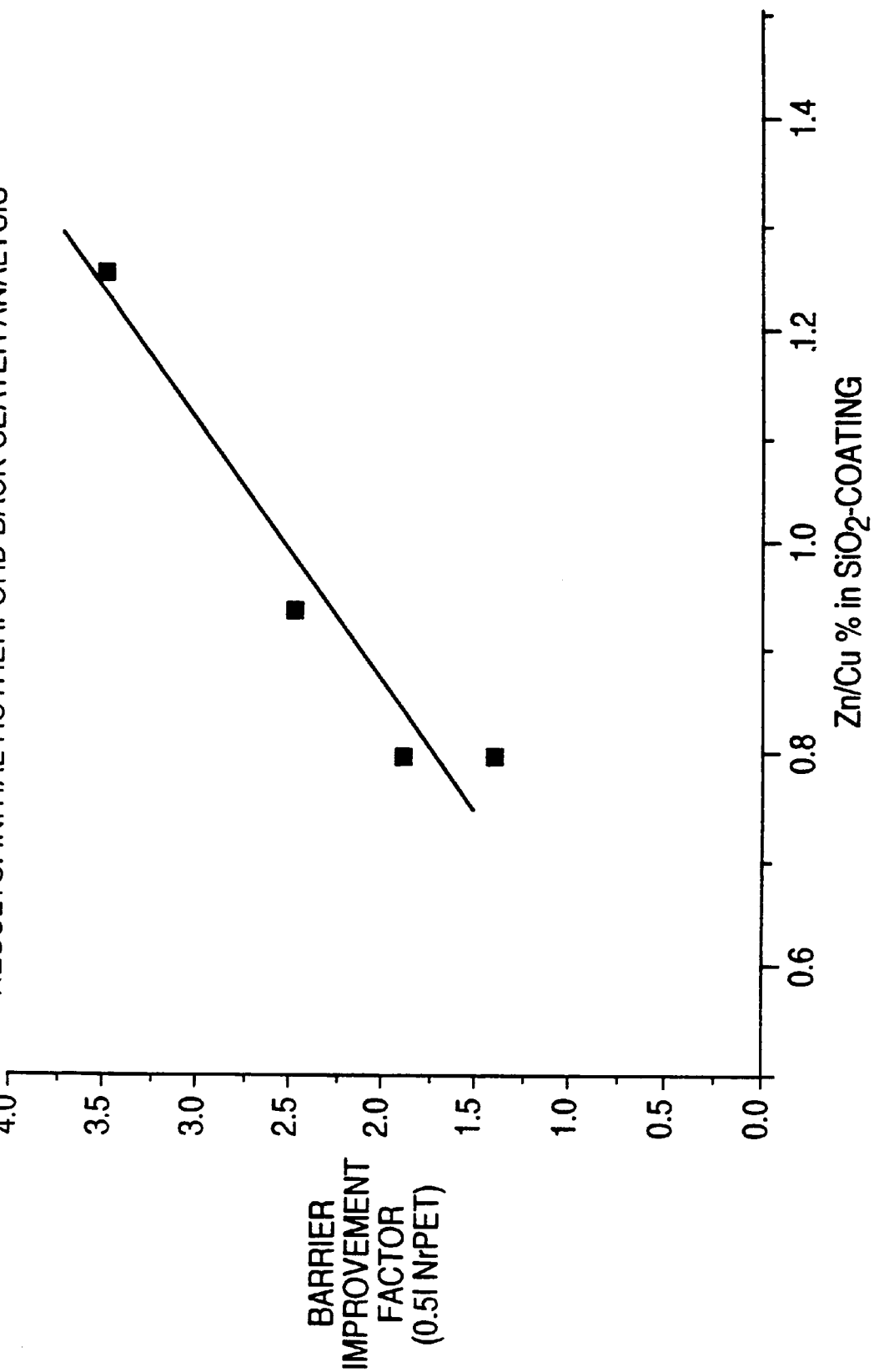
FIG. 9 is a graph showing improvements in gas barrier factor with increasing content of Zn or Cu.

FIG. 9 is a graph showing improved barrier effect showing the importance of coating composition to gas barrier. A small change in Zn composition can have a large effect on the barrier enhancement.

FIG. 10 is a flow chart illustrating a physical recycling process. In recycling, either physical recycling or chemical recycling are normally carried out for plastic containers. In physical recycling, a batch of plastic is provided as indicated in step 100. While this plastic can include a single type of item, it is contemplated that both coated and uncoated plastics will be provided. In a conventional process indicated in step 102, these coated and uncoated plastics must be separated. This can be a labor intensive step and will result in increased costs for recycling.

With the instant invention, this separating step 102 can be avoided. In particular, step 104 indicates mixing of coated and uncoated containers. While this step can certainly be done at the recycling station, it is contemplated that the actual mixing could take place prior to the arrival of the plastic at the recycling station. For example, when the plastic is picked-up by a refuse vehicle and taken to the recycling center, such mixing could then occur. An advantage of the instant invention is that when plastic to be recycled is mixed with coated plastic being with non-coated plastic, separation of these two plastics is unnecessary. In practice, this is, in fact, impracticable. Accordingly, when introducing coated containers into the recycling steam, the recycling process is unaffected.

As in a conventional process, the mixed plastics are ground into flakes in step 106. An optional step of washing the flakes 108 can be carried out. In fact, a washing step could occur at many other times during the process.

After the step of washing 108, if it is carried out, or after the step of grinding 106, the ground flakes are melt extruded at step 110. A step of forming 112 then occurs which merely indicates that something is done with the extrusion. For example, pellets, flakes or other configured plastics could be melt extruded and then blow molded or injection molded. Many other uses for the recycled plastic are possible. The blow molded or injection molded plastic can be reused for containers and in particular, can be used for beverage containers. In fact, the batch plastic initially provided in the method at step 100 can be plastic beverage containers whereby bottle-to-bottle recycling is possible. Of course, the type of plastic handle and the output of the recycling process is not limited.

Apart from the steps of physical recycling, the instant invention is also applicable to a chemical recycling process as shown in FIG. 11. Again, plastics are provided in a step 114. Conventionally, a separating step 116 was necessary. The instant invention avoids such a separating step 116. Similarly to the above-described physical recycling, a mixing step 118 for coated and uncoated plastic is indicated. This mixing can take place at the recycling station or prior to the plastic's arrival at this station.

In chemical recycling, the plastic is depolymerized by conventional processes as indicated in step 120. To indicate the flexibility of the instant invention, it is contemplated that separated coated and uncoated plastic could be provided in the step 114. These separate plastics would be separately depolymerized in step 120 but would be mixed together in step 122. This optional mixing step 122 is merely to indicate the flexibility of the instant invention.

After the plastic is depolymerized, it is repolymerized in step 124. This plastic can then be formed into a desired article such as by blow molding or extrusion molding as indicated in step 126. Similarly to the physical recycling process, the chemical recycling process can handle and produce many types of plastics. For example, bottle-to-bottle recycling is possible.

Another benefit to the recycling process of the instant invention is that haziness in the final recycled product is avoided. Because relatively small particles are used in the coating, a haze in the finally produced recycled product can be avoided. Moreover, the coating is acceptable for food contact and therefore will not adversely affect the recycling efforts when ground or depolymorized in the recycling processes.

The plastic produced in either recycling process can be injection molded or blow molded as noted above. Even if a coated plastic is initially introduced in the recycling process, the coating of the present invention will not interfere with the downstream injection molding or blow molding processes.

While the particular physical and chemical recycling have been discussed, it should be appreciated that the instant invention can also be applied in other types of recycling processes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A system for coating an external surface of a container wherein the container on pressurization possess a gas barrier at least 1.25×greater than a similar uncoated container, the system comprising:
    a vacuum cell, pressure within the vacuum cell being reduced as compared to ambient pressure;
    means for continuously supplying containers to and withdrawing containers from the vacuum cell while maintaining the pressure within the vacuum cell;
    at least one source disposed within the vacuum cell for supplying a coating vapor to the external surface of the containers in the vacuum cell, the at least one source of coating vapor including an evaporator for heating and evaporating an inorganic coating material to form the coating vapor; and
    means for supplying at least one reactive gas to an interior of the vacuum cell;
    the at least one source of coating vapor structured and arranged within the vacuum housing such that the coating vapor from the at least one source reacts with the reactive gas and deposits a relatively thin coating on the external surface of the containers, the thin coating comprises an inorganic compound, and bonding between at least a portion of the relatively thin coating deposited on the container and the external surface of the container occurs.

2. The system for coating as recited in claim 1, wherein the at least one source supplies the coating vapor from a solid source.

3. The system for coating as recited in claim 2, wherein the solid source is a nonpowder.

4. The system for coating as recited in claim 1, wherein the means for causing coating causes at least one of chemical bonding and physical bonding with the container.

5. The system for coating as recited in claim 1, further including a plasma-enhanced device to provide means for causing the bonding.

6. The system for coating as recited in claim 1, further comprising a device for degassing the containers prior to deposition of the relatively thin coating on the external surface of the containers, the degassing of the containers providing means for causing the bonding.

7. The system for coating as recited in claim 1, wherein the container is a temperature sensitive plastic bottle with a neck and wherein the system includes means for gripping the neck of the bottle.

8. The system for coating as recited in claim 1, further comprising means for rotating the containers during transport through the vacuum cell.

9. The system for coating as recited in claim 1, wherein the at least one reactive gas supplied by the means for supplying being selected from the group consisting of oxygen, nitrogen, sulfur and halogens.

10. The system for coating as recited in claim 9, wherein the at least one gas is oxygen.

11. The system for coating as recited in claim 9, wherein said gas and vapor from the at least one source provide at least one of color coating for the container, ultraviolet absorbent coating for the container and a gas barrier for the container.

12. The system for coating as recited in claim 9, wherein said gas and vapor from the at least one source provide at least one of color coating for the container and ultraviolet absorbent coating for the container.

13. The system for coating as recited in claim 1, further comprising means for coating less than all of the external surface of the container by the coating vapor from the at least one source.

14. The system for coating as recited in claim 1, further comprising a conveying device positioned within the vacuum cell, the conveying device moving the container through the vacuum cell past the at least one source.

15. The system for coating as recited in claim 1, wherein the container includes an interior chamber and wherein the system further comprises:
    an antenna insertable into and removable from the interior chamber of the container; and
    means for orienting the antenna when a longitudinal axis of the container is generally horizontally oriented.

16. The system for coating as recited in claim 1, wherein the container includes an interior chamber and wherein the system further comprises:
    an antenna insertable into and removable from the interior chamber of the container; and
    means for orienting the antenna when a longitudinal axis of the container is generally vertically oriented.

17. The system for coating as recited in claim 1, further comprising an antenna provided within the vacuum cell.

18. The system for coating as recited in claim 1, further comprising means for generating a magnetic field within the vacuum cell wherein the field acts to direct the coating vapor.

19. The system for coating as recited in claim 1, wherein the at least one source supplies an inorganic vapor to the vacuum cell whereby the thin coating deposited on the container is an inorganic solid coating.

20. A system for coating an external surface of a container wherein the container on pressurization possess a gas barrier at least 1.25×greater than a similar uncoated container, the system comprising:
    a vacuum cell, pressure within the vacuum cell being reduced as compared to ambient pressure;
    means for supplying containers to and withdrawing containers from the vacuum cell;
    a conveying device positioned within the vacuum cell, the conveying device moving the container through the vacuum cell past the at least one source; and
    at least one source for supplying a coating vapor to the external surface of the containers in the vacuum cell, the coating vapor from the at least one source depositing a relatively thin coating on the external surface of the containers whereby bonding between at least a portion of the relatively thin coating deposited on the container and the external surface of the container occurs, wherein the conveying device includes a container bar for holding the container, a slow-moving section and a fast-moving section, the container bar being transferable between the slow-moving section and the fast moving section whereby the container on the container bar can be moved at a first speed and then at a second speed through the vacuum cell, the first speed being slower than the second speed.

21. The system for coating as recited in claim 20, further comprising means for rotating the containers during the transfer from the slow-moving conveyor to the fast-moving conveyor.

22. The system for coating as recited in claim 20, wherein the container has a longitudinal axis and wherein the conveying device further includes means for orienting the longitudinal axis of the container vertically and horizontally within the vacuum cell, the longitudinal axis of the container being generally vertically oriented when the container is being moved at the first speed by the slow-moving section and being generally horizontally oriented when the container is being moved at the second speed by the fast-moving section.

23. The system for coating as recited in claim 22, wherein the container includes an interior chamber and wherein the system further comprises an antenna insertable into and removable from the interior chamber of the container and means for orienting the antenna to generally face the at least one source during coating.

24. The system for coating as recited in claim 18, further comprising magnetic orientating means for orienting the antenna when the longitudinal axis of the container is generally vertically oriented.

25. The system for coating as recited in claim 23, wherein the means for orienting includes a heavy section of the antenna which is rotatable under the influence of gravity to face a bottom of the vacuum cell when the antenna and the longitudinal axis of the container are generally horizontally oriented.

26. The system for coating as recited in claim 23, wherein the antenna is pivotable toward and away from a wall of the interior chamber of the container for facilitating insertion and removal of the antenna into and out of the container.

27. The system for coating as recited in claim 23, further comprising means for rotating the container around the longitudinal axis of the container, the antenna being within the container during rotation by the means for rotating and the antenna being oriented within the container independent of rotation of the container.

28. A system for coating an external surface of a container wherein the container on pressurization has enhanced environmental stress crack resistance, the system comprising:

a vacuum cell, pressure within the vacuum cell being reduced as compared to ambient pressure;

means for supplying containers to and withdrawing containers from the vacuum cell; and at least one source disposed within the vacuum cell for supplying a coating vapor to the external surface of the containers in the vacuum cell, the at least one source of coating vapor including an evaporator for heating and evaporating an inorganic coating material to form the coating vapor; and means for supplying at least one reactive gas to an interior of the vacuum cell;

the at least one source of coating vapor structured and arranged within the vacuum housing such that the coating vapor from the at least one source reacts with the reactive gas and deposits a relatively thin coating on the external surface of the containers, the thin coating comprises an inorganic compound, and bonding between at least a portion of the relatively thin coating deposited on the container and the external surface of the container occurs.

29. The system for coating as recited in claim 28, wherein the at least one source supplies the coating vapor from a solid source.

30. The system for coating as recited in claim 29, wherein the solid source is a nonpowder.

31. The system for coating as recited in claim 28, wherein the means for causing coating causes at least one of chemical bonding and physical bonding with the container.

32. The system for coating as recited in claim 28, further comprising a plasma-enhanced device to provide means for causing the bonding.

33. The system for coating as recited in claim 28, further comprising a device for degassing the containers prior to deposition of the relatively thin coating on the external surface of the containers, the degassing of the containers providing means for causing the bonding.

34. The system for coating as recited in claim 28, wherein the container is a temperature sensitive plastic bottle with a neck and wherein the system includes means for gripping the neck of the bottle.

35. The system for coating as recited in claim 28, further comprising means for rotating the containers during transport through the vacuum cell.

36. The system for coating as recited in claim 28, wherein the at least one reactive gas supplied by the means for supplying being selected from the group consisting of oxygen, nitrogen, sulfur and halogens.

37. The system for coating as recited in claim 36, wherein the at least one gas is oxygen.

38. The system for coating as recited in claim 36, wherein said gas and vapor from the at least one source provide at least one of color coating for the container, ultraviolet absorbent coating for the container and a gas barrier for the container.

39. The system for coating as recited in claim 36, wherein said gas and vapor from-the at least one source provide at least one of color coating for the container and ultraviolet absorbent coating for the container.

40. The system for coating as recited in claim 28, further comprising means for coating less than all of the external surface of the container by the coating vapor from the at least one source.

41. The system for coating as recited in claim 28, further comprising a conveying device positioned within the vacuum cell, the conveying device moving the container through the vacuum cell past the at least one source.

42. The system for coating as recited in claim 28, wherein the container includes an interior chamber and wherein the system further comprises:

an antenna insertable into and removable from the interior chamber of the container; and means for orienting the antenna when a longitudinal axis of the container is generally horizontally oriented.

43. The system for coating as recited in claim 28, wherein the container includes an interior chamber and wherein the system further comprises:

an antenna insertable into and removable from the interior chamber of the container; and means for orienting the antenna when a longitudinal axis of the container is generally vertically oriented.

44. The system for coating as recited in claim 28, further comprising an antenna provided within the vacuum cell.

45. The system for coating as recited in claim 28, further comprising means for generating a magnetic field within the vacuum cell wherein the field acts to direct the coating vapor.

46. The system for coating as recited in claim 28, wherein the at least one source supplies an inorganic vapor to the vacuum cell whereby the thin coating deposited on the container is an inorganic solid coating.

47. A system for coating an external surface of a container wherein the container on pressurization has enhanced environmental stress crack resistance, the system comprising:
   a vacuum cell, pressure within the vacuum cell being reduced as compared to ambient pressure;
   means for supplying containers to and withdrawing containers from the vacuum cell;
   a conveying device positioned within the vacuum cell, the conveying device moving the container through the vacuum cell past the at least one source; and
   at least one source for supplying a coating vapor to the external surface of the containers in the vacuum cell, the coating vapor from the at least one source depositing a relatively thin coating on the external surface of the containers, whereby bonding between at least a portion of the relatively thin coating deposited on the container and the external surface of the container occurs,
   wherein the for holding fast-moving transferable fast moving container bar conveying device includes a container bar the container, a slow-moving section and a section, the container bar being between the slow-moving section and the section whereby the container on the can be moved at a first speed and then at a second speed through the vacuum cell, the first speed being slower than the second speed.

48. The system for coating as recited in claim 47, further comprising means for rotating the containers during the transfer from the slow-moving conveyor to the fast-moving conveyor.

49. The system for coating as recited in claim 47, wherein the container has a longitudinal axis and wherein the conveying device further includes means for orienting the longitudinal axis of the container vertically and horizontally within the vacuum cell, the longitudinal axis of the container being generally vertically oriented when the container is being moved at the first speed by the slow-moving section and being generally horizontally oriented when the container is being moved at the second speed by the fast-moving section.

50. The system for coating as recited in claim 49, wherein the container includes an interior chamber and wherein the system further comprises an antenna insertable into and removable from the interior chamber of the container and means for orienting the antenna to generally face the at least one source during coating.

51. The system for coating as recited in claim 50, further comprising magnetic orientating means for orienting the antenna when the longitudinal axis of the container is generally vertically oriented.

52. The system for coating as recited in claim 50, wherein the means for orienting includes a heavy section of the antenna which is rotatable under the influence of gravity to face a bottom of the vacuum cell when the antenna and the longitudinal axis of the container are generally horizontally oriented.

53. The system for coating as recited in claim 50, wherein the antenna is pivotable toward and away from a wall of the interior chamber of the container for facilitating insertion and removal of the antenna into and out of the container.

54. The system for coating as recited in claim 50, further comprising means for rotating the container around the longitudinal axis of the container, the antenna being within the container during rotation by the means for rotating and the antenna being oriented within the container independent of rotation of the container.

* * * * *